United States Patent
Oh

(10) Patent No.: US 11,055,229 B2
(45) Date of Patent: Jul. 6, 2021

(54) MEMORY CONTROLLER INCLUDING ADDRESS TRANSLATION MODULE, MEMORY SYSTEM INCLUDING THE MEMORY CONTROLLER, AND OPERATING METHOD OF THE MEMORY CONTROLLER

(71) Applicant: Samsung Electronics Co., Ltd., Suwon-si (KR)

(72) Inventor: Eun Chu Oh, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 8 days.

(21) Appl. No.: 16/446,912

(22) Filed: Jun. 20, 2019

(65) Prior Publication Data

US 2020/0167290 A1    May 28, 2020

(30) Foreign Application Priority Data

Nov. 22, 2018  (KR) .......... 10-2018-0145647

(51) Int. Cl.
| | |
|---|---|
| *G06F 12/10* | (2016.01) |
| *G06F 7/58* | (2006.01) |
| *G06F 13/16* | (2006.01) |
| *G06F 12/02* | (2006.01) |
| *G11C 16/22* | (2006.01) |

(52) U.S. Cl.
CPC .............. *G06F 12/10* (2013.01); *G06F 7/588* (2013.01); *G06F 12/0246* (2013.01); *G06F 13/1668* (2013.01); *G11C 16/22* (2013.01)

(58) Field of Classification Search
CPC ...... G06F 12/10; G06F 7/588; G06F 13/1668; G06F 12/0246; G06F 7/582; G06F 2212/7201; G06F 12/0238; G06F 2212/1036; G11C 16/22; G11C 8/20; G11C 16/08; G11C 13/0023; G11C 13/0059; G11C 7/24
USPC .......... 713/189; 708/250; 711/200, 202, 217, 711/103; 365/185.01, 189.011, 230.01
See application file for complete search history.

(56) References Cited

U.S. PATENT DOCUMENTS

| | | | |
|---|---|---|---|
| 8,130,955 | B2 | 3/2012 | Trichina et al. |
| 8,566,377 | B2 | 10/2013 | Harris et al. |
| 8,806,171 | B2 | 8/2014 | Seong et al. |
| 9,396,118 | B2 | 7/2016 | Dong |
| 9,823,899 | B2 | 11/2017 | Katoh |
| 9,892,036 | B2 | 2/2018 | Shin |
| 2013/0205139 | A1* | 8/2013 | Walrath ............. G06F 21/72 713/190 |

(Continued)

FOREIGN PATENT DOCUMENTS

KR    10-2014-0089744    7/2014

*Primary Examiner* — Hong C Kim
(74) *Attorney, Agent, or Firm* — Muir Patent Law, PLLC

(57) ABSTRACT

A memory system includes a memory device including a plurality of memory cells, and a memory controller configured to control the memory device. The memory controller includes a random number generator configured to generate a random number based on read data from the memory device, and an address translation module configured to generate a key based on the random number and to translate a first address into a second address by performing a calculation on the first address and the key.

19 Claims, 22 Drawing Sheets

(56) References Cited

U.S. PATENT DOCUMENTS

| | | | |
|---|---|---|---|
| 2014/0037086 A1* | 2/2014 | Seol | H04L 9/0869 380/44 |
| 2015/0019878 A1* | 1/2015 | Gammel | G06F 12/10 713/190 |
| 2015/0149701 A1* | 5/2015 | Lin | G11C 11/5642 711/103 |
| 2015/0193204 A1* | 7/2015 | Lin | G06F 7/588 708/250 |
| 2015/0331810 A1* | 11/2015 | Gammel | G06F 12/1408 726/29 |
| 2016/0028544 A1 | 1/2016 | Hyde et al. | |
| 2017/0288885 A1 | 10/2017 | Zadeh et al. | |

* cited by examiner

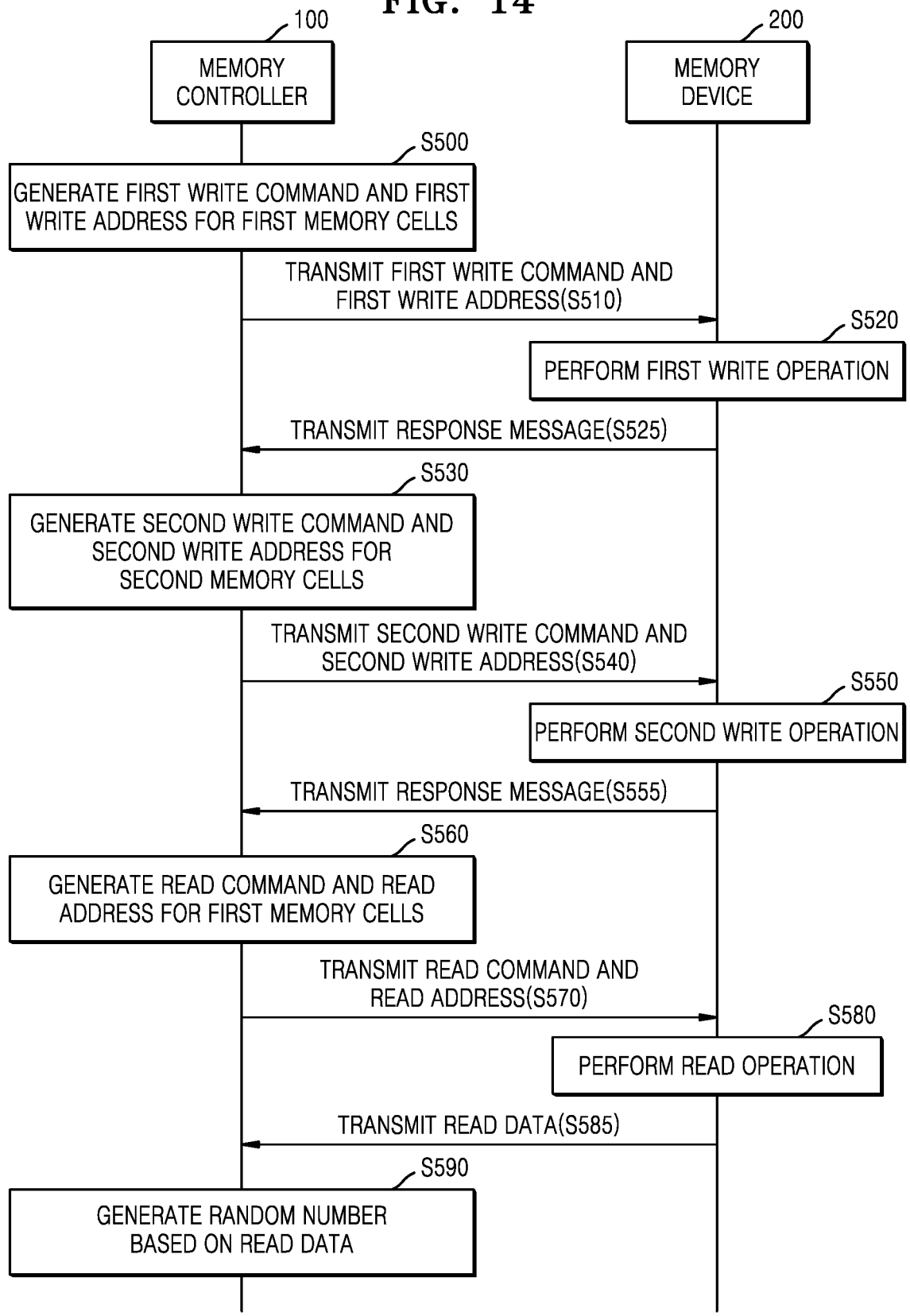

| LA | PA |
|---|---|
| LA1 | PAa |
| LA2 | PAb |
| ... | ... |

PA1 (00) XOR KEY (11) = PA3 (11)
PA1 (01) XOR KEY (11) = PA3 (10)
PA1 (10) XOR KEY (11) = PA3 (01)
PA1 (11) XOR KEY (11) = PA3 (00)

MEMORY CONTROLLER INCLUDING ADDRESS TRANSLATION MODULE, MEMORY SYSTEM INCLUDING THE MEMORY CONTROLLER, AND OPERATING METHOD OF THE MEMORY CONTROLLER

CROSS-REFERENCE TO RELATED APPLICATION

This application claims the benefit of Korean Patent Application No. 10-2018-0145647, filed on Nov. 22, 2018, in the Korean Intellectual Property Office, the disclosure of which is incorporated herein in its entirety by reference.

BACKGROUND

The inventive concept relates to a memory controller, and more particularly, to a memory controller including a random number generator, a memory system including the memory controller, and an operating method of the memory controller.

As a nonvolatile memory device, resistive memories such as phase change random access memory (PRAM), nano floating gate memory (NFGM), polymer RAM (PoRAM), magnetic RAM (MRAM), ferroelectric RAM (FeRAM), and resistive RAM (RRAM) are known in addition to a flash memory. A resistive memory has a high-speed property of dynamic RAM (DRAM) and a memory nonvolatile characteristic. In this case, the resistive memory may have relatively high threshold voltage fluctuation.

SUMMARY

The inventive concept provides a memory controller capable of improving endurance of a memory system and reinforcing security of the memory system, a memory system including the memory controller, and an operating method of the memory controller.

According to an aspect of the inventive concept, there is provided a memory system including: a memory device including a memory cell array having a plurality of first memory cells; and a memory controller configured to control the memory device, wherein the memory controller includes: a random number generator configured to generate a random number based on read data from the memory device; and an address translation module configured to generate a key based on the random number and to translate a first address into a second address by performing a calculation on the first address and the key.

According to another aspect of the inventive concept, there is provided an operating method of a memory controller, the operating method including: performing a read operation on a memory device to receive read data from the memory device; generating, by a random number generator included in the memory controller, a random number based on the read data; and randomly generating, by using the random number, a first physical address for accessing the memory device or writing data to be written in the memory device.

According to another aspect of the inventive concept, there is provided a memory controller including: a random number generator configured to generate a random number based on read data from a memory device; an address translation module configured to translate, by using the random number, a logical address received from a host into a first physical address of the memory device and to translate the first physical address into a second physical address of the memory device; and a randomizer configured to translate input data received from the host into random data by using the random number.

BRIEF DESCRIPTION OF THE DRAWINGS

Embodiments of the inventive concept will be more clearly understood from the following detailed description taken in conjunction with the accompanying drawings in which:

FIG. 14 is a signaling diagram of operations of the memory controller and the memory device, according to an embodiment of the inventive concept;

DETAILED DESCRIPTION OF THE EMBODIMENTS

Hereinafter, embodiments of the inventive concept will be described in detail with reference the accompanying drawings.

Figure 1:
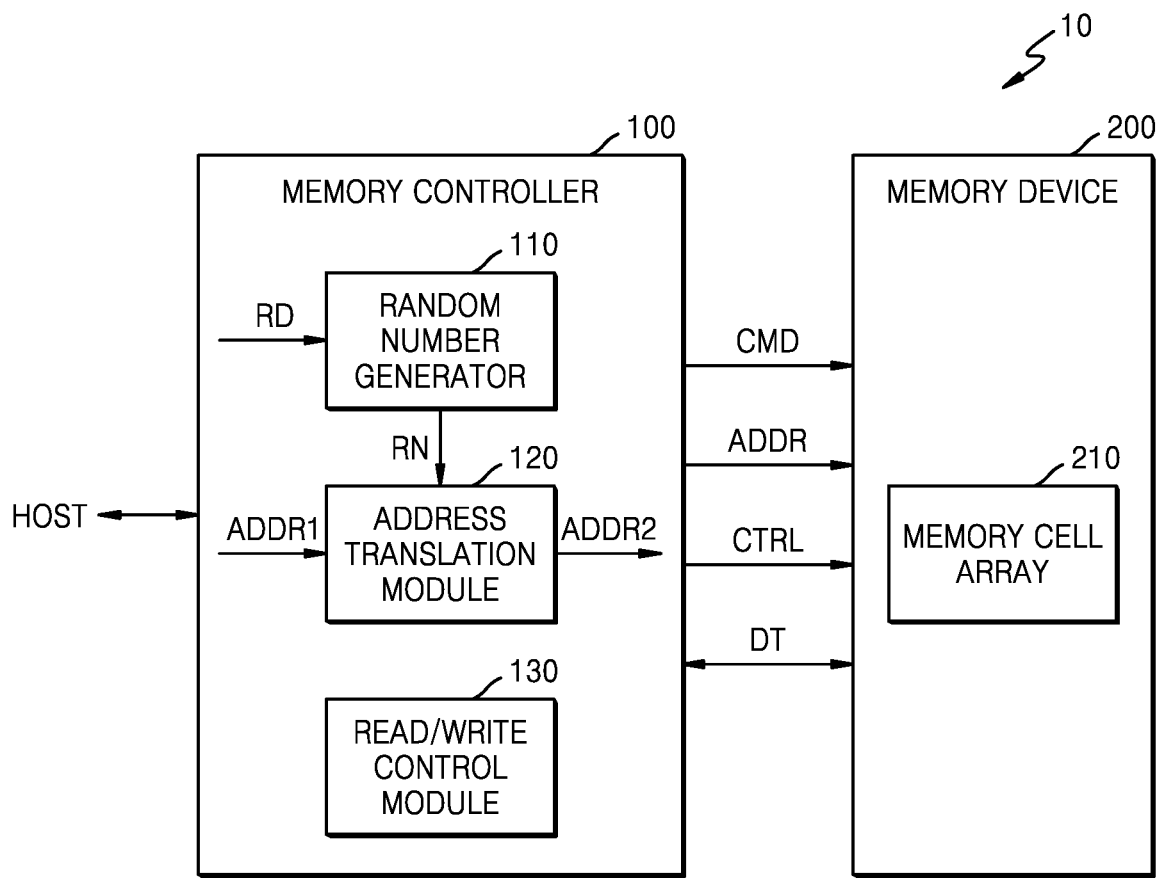
FIG. 1 is a block diagram of a memory system according to an embodiment of the inventive concept.

FIG. 1 is a block diagram of a memory system 10 according to an embodiment of the inventive concept.

Referring to FIG. 1, the memory system 10 may include a memory controller 100 and a memory device 200. The memory controller 100 may control the memory device 200 to write data in the memory device 200 or read data stored in the memory device 200, in response to a write/read request from a host. For example, the memory controller 100 may control write and read operations of the memory device 200 by providing a command CMD, an address ADDR, and a control signal CTRL to the memory device 200. In addition, data DT may be transmitted and received between the memory controller 100 and the memory device 200.

The memory device 200 may include a memory cell array 210. According to an embodiment, the memory cell array 210 may include resistive memory cells, and the memory device 200 may be named "resistive memory device". Hereinafter, the memory device 200 is assumed as a resistive memory device. However, the inventive concept is not limited thereto, and embodiments of the inventive concept may be applied to various types of memory devices including nonvolatile memory devices such as a flash memory device or volatile memory devices.

The resistive memory cells included in the memory cell array 210 may have relatively high threshold voltage fluctuation. For example, the resistive memory cell may include a switching element and a variable resistance element and may have relatively high threshold voltage fluctuation according to variation of the switching element due to noise or the like of the switching element, or to variation of the variable resistance element. This will be described in detail with reference to FIG. 2.

Figure 2:
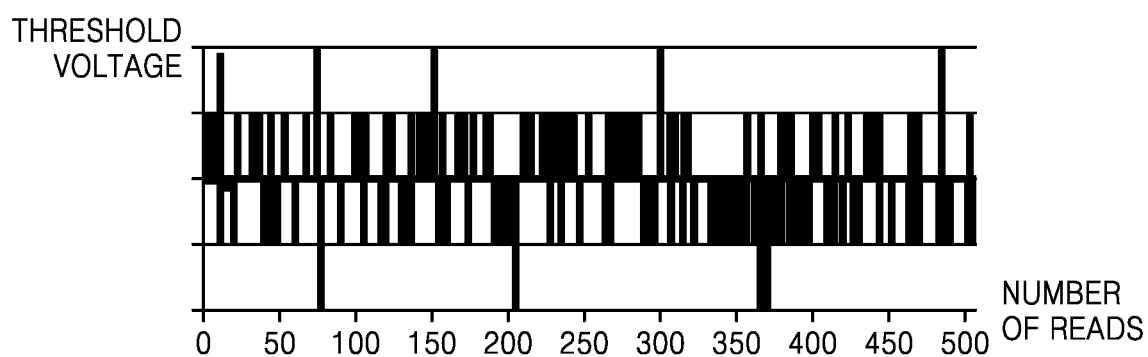
FIG. 2 illustrates a threshold voltage of a resistive memory cell with respect to a number of reads, according to an embodiment of the inventive concept.

FIG. 2 illustrates a threshold voltage of a resistive memory cell with respect to a number of reads, according to an embodiment of the inventive concept.

Referring to FIG. 2, when the resistive memory cell is programed in a first program state, the threshold voltage of the resistive memory cell may fluctuate. Accordingly, when a read operation on the resistive memory cell is repetitively performed, a read result may vary depending on the number of reads. In addition, when a plurality of resistive memory cells are programed in the first program state, threshold voltages of the plurality of resistive memory cells may fluctuate. Accordingly, when a read operation on the plurality of resistive memory cells is performed, a read result may vary.

Referring back to FIG. 1, the memory controller 100 may include a random number generator 110 and an address translation module 120. The random number generator 110 may generate a random number RN based on read data RD received from the memory device 200. As described above, the random number generator 110 may generate the random number RN from the read data RD received from the memory device 200, by using a threshold voltage fluctuation characteristic of the resistive memory cells included in the memory cell array 210. According to an embodiment, the random number generator 110 may be a true random number generator (TRNG).

A random number as used herein may include a pseudo random number. In this disclosure, a number is considered to be a random number RN if the value of the number is responsive to a random number (which may be a pseudo random number generated by a pseudo random number generator).

The embodiments are described, and illustrated in the drawings, in terms of functional blocks, units and/or modules. These blocks, units and/or modules may be physically implemented by electronic (or optical) circuits such as logic circuits, discrete components, microprocessors, hard-wired circuits, memory elements, wiring connections, and the like, which may be formed together in a single integrated circuit (e.g., as a single semiconductor chip) or as separate integrated circuits and/or discrete components (e.g., several semiconductor chips wired together on a printed circuit board) using semiconductor fabrication techniques and/or other manufacturing technologies.

The address translation module 120 may translate a first address ADDR1 into a second address ADDR2 by using the random number RN. According to an embodiment, the address translation module 120 may generate a key from the random number RN and generate the second address ADDR2 through a calculation on the generated key and the first address ADDR1. According to an embodiment, the first address ADDR1 may be a logical address received from the host, and the second address ADDR2 may be a physical address of the memory device 200. In this case, the key may be named "mapping key", and the logical address may be translated into the physical address through a calculation on the logical address and the mapping key. According to an embodiment, the first address ADDR1 may be an original physical address of the memory device 200, and the second address ADDR2 may be a new physical address of the memory device 200. In this case, the key may be named "remapping key", and the original physical address may be translated into the new physical address through a calculation on the original physical address and the remapping key.

According to some embodiments, the memory controller 100 may further include a read/write control module 130. The read/write control module 130 may control a read operation on the memory device 200 to provide the read data RD to the random number generator 110. According to an embodiment, the read/write control module 130 may determine a read voltage for a plurality of memory cells as a first voltage level and control a read operation on the plurality of memory cells by using the read voltage determined as the first voltage level.

In addition, the read/write control module 130 may control a write operation on the memory device 200 to provide the read data RD to the random number generator 110. In detail, the read/write control module 130 may control a write operation on the memory device 200 to modify a threshold voltage distribution of the plurality of memory cells before a read operation on the plurality of memory cells. In addition, the read/write control module 130 may control a write operation on the memory device 200 such that data is written in memory cells corresponding to the translated second address ADDR2.

According to an embodiment, the memory controller 100 and the memory device 200 may be implemented by separate semiconductor devices. Each of the semiconductor devices may be an integrated circuit embodied within a semiconductor chip. According to an embodiment, the memory controller 100 and the memory device 200 may be integrated in a single semiconductor device. For example, the memory controller 100 and the memory device 200 may be integrated in a single semiconductor device to form a memory card. In more detail, the memory controller 100 and the memory device 200 may be integrated in a single semiconductor device to form a personal computer (PC) card (personal computer memory card international association (PCMCIA)), a compact flash (CF) card a smart media card (SM/SMC), a memory stick, a multimedia card (MMC), a reduced size MMC (RS-MMC), MMCmicro, a secure digital (SD) card, a miniSD card, a microSD card, a universal flash storage (UFS) device, or the like. In some examples, the memory controller 100 and the memory device 200 may be integrated in a single semiconductor device to form a solid state disk/drive (SSD).

Figure 3A:
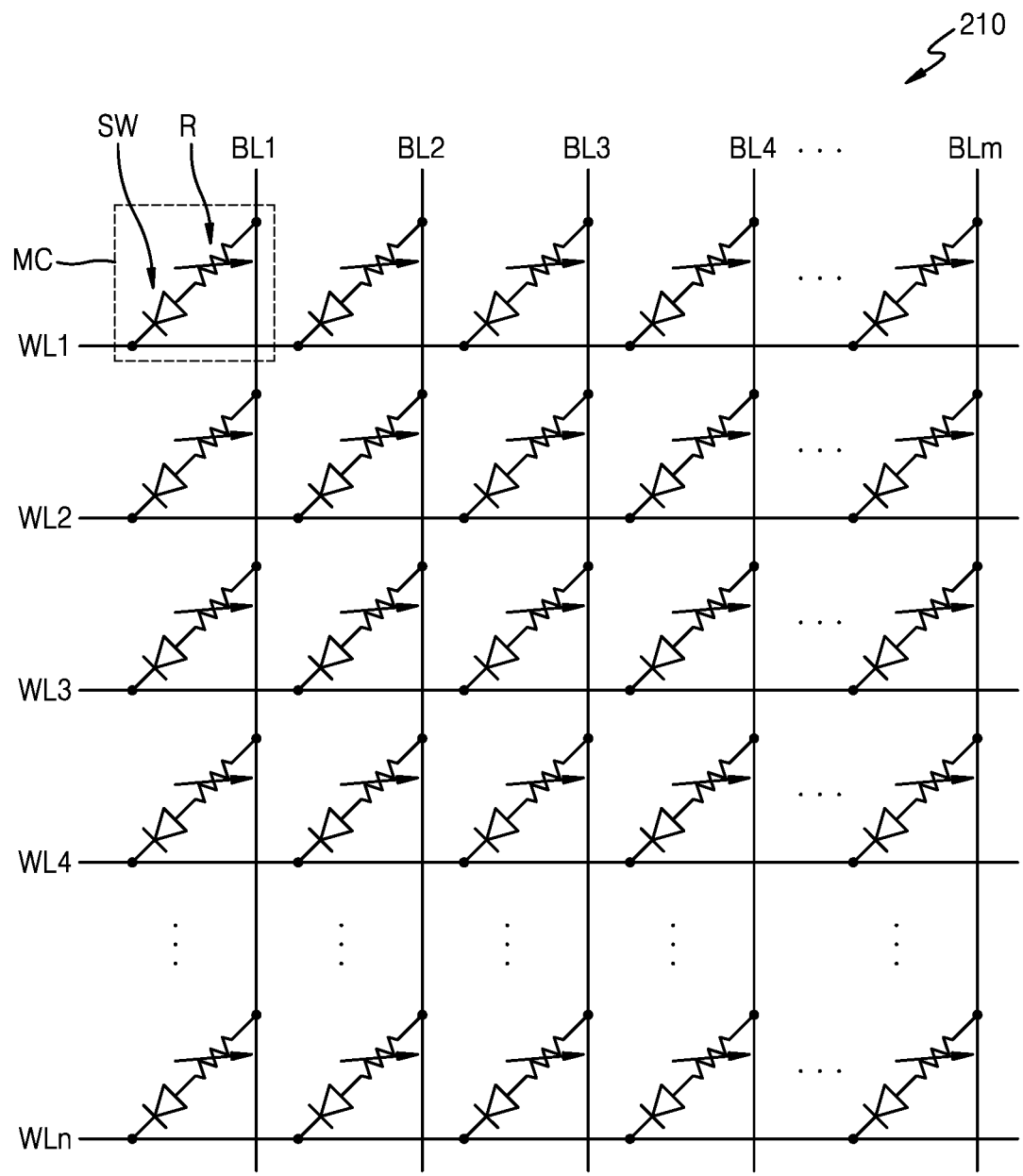
FIG. 3A illustrates a memory cell array shown in FIG. 1.

FIG. 3A illustrates the memory cell array 210 shown in FIG. 1.

Referring to FIG. 3A, the memory cell array 210 may include a plurality of word lines WL1 to WLn, a plurality of bit lines BL1 to BLm, and a plurality of memory cells MC. Herein, the number of word lines WL1 to WLn, the number of bit lines BL1 to BLm, and the number of memory cells MC may be variously changed according to embodiments, and n and m denote random positive integers. The memory cell array 210 may include the plurality of memory cells MC located in regions in which the plurality of word lines WL1 to WLn cross the plurality of bit lines BL1 to BLm, respectively, and accordingly, the memory device 200 may be named "cross-point memory device".

The memory cell array 210 may include a plurality of memory blocks, and each memory block may include a plurality of pages. In addition, each memory cell MC may be a single-level cell (SLC) that sores one bit or a multi-level cell (MLC) capable of storing data of at least two bits. According to an embodiment, the memory cell array 210 may be a horizontal-structure two-dimensional (2D) memory cell array. According to an embodiment, the memory cell array 210 may be a vertical-structure 3D memory cell array.

The memory cell array 210 may include resistive memory cells each including a variable resistance element. According to an embodiment, when the variable resistance element is a phase change material (germanium (Ge)-antimony (Sb)-tellurium (Te) (GST)) and has a resistance changing according to a temperature, the memory device 200 may be PRAM. According to an embodiment, when the variable resistance element consists of an upper electrode, a lower electrode, and a transition metal oxide therebetween, the memory device 200 may be RRAM. According to an embodiment, when the variable resistance element consists of an upper electrode of a magnetic body, a lower electrode of the magnetic body, and a dielectric therebetween, the memory device 200 may be MRAM.

According to the present embodiment, each of the plurality of memory cells MC may include a variable resistance element R and a switching element SW, wherein the variable resistance element R may be named a variable resistance material, and the switching element SW may be named a select element. According to an embodiment, the variable resistance element R may be connected between one of the plurality of bit lines BL1 to BLm and the switching element SW, and the switching element SW may be connected between the variable resistance element R and one of the plurality of word lines WL1 to WLn. However, the inventive concept is not limited thereto, and the switching element SW may be connected between one of the plurality of bit lines BL1 to BLm and the variable resistance element R, and the variable resistance element R may be connected between the switching element SW and one of the plurality of word lines WL1 to WLn.

The switching element SW may be connected between any one of the plurality of word lines WL1 to WLn and the variable resistance element R, and may control a current to be supplied to the variable resistance element R, according to voltages applied to the connected word line and a bit line. Although FIG. 3A shows that the switching element SW is a diode, this is only an embodiment of the inventive concept. According to an embodiment, the switching element SW may be replaced by another switchable element.

Figure 3B:
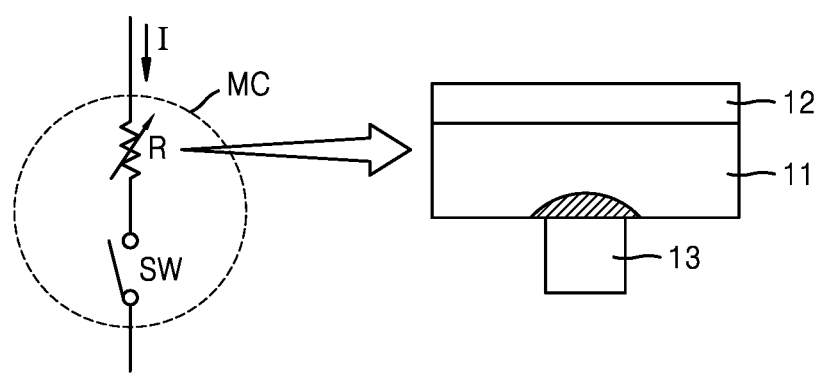
FIG. 3B illustrates a memory cell shown in FIG. 3A.

FIG. 3B illustrates the memory cell MC shown in FIG. 3A.

Referring to FIG. 3B, the memory cell MC may include the variable resistance element R and the switching element SW. The switching element SW may be implemented by using various elements such as a transistor and a diode. The variable resistance element R may include a phase change layer 11 formed of a mixture of Ge, Sb, and Te (GST), an upper electrode 12 formed on the phase change layer 11, and a lower electrode 13 formed under the phase change layer 11.

The upper and lower electrodes 12 and 13 may be formed of various metals, metal oxides, or metal nitrides. The upper and lower electrodes 12 and 13 may include aluminum (Al), copper (Cu), titanium nitride (TiN), titanium aluminum nitride ($Ti_xAl_yN_z$), iridium (Ir), platinum (Pt), silver (Ag), gold (Au), poly silicon, tungsten (W), titanium (Ti), tantalum (Ta), tantalum nitride (TaN), tungsten nitride (WN), nickel (Ni), cobalt (Co), chromium (Cr), antimony (Sb), iron (Fe), molybdenum (Mo), palladium (Pd), tin (Sn), zirconium (Zr), zinc (Zn), iridium oxide ($IrO_2$), strontium-zirconium oxide ($StZrO_3$), or the like.

The phase change layer 11 may be formed of a bipolar resistance memory material or a unipolar resistance memory material. The bipolar resistance memory material may be programmed to a set or reset state by a polarity of a current, and perovskite-group materials may be used for the bipolar resistance memory material. The unipolar resistance memory material may be programmed to the set or reset state even by a current of the same polarity, and a transition metal oxide such as nickel oxide ($NiO_x$) or titanium oxide ($TiO_x$), or the like.

A GST material may be programed between an amorphous state having a relatively high resistivity and a crystalline state having a relatively low resistivity. The GST material may be programmed by heating the GST material. A strength and time of heating may determine whether the GST material maintains the amorphous state or the crystalline state. The high resistivity and the low resistivity may represent programmed values as logic 0 and logic 1, respectively, and may be sensed by measuring a resistivity of the GST material. On the contrary, the high resistivity and the low resistivity may represent programmed values as logic 1 and logic 0, respectively.

In FIG. 3B, when a program current I is applied to the memory cell MC, the applied program current I flows through the lower electrode 13. When the program current I is applied to the memory cell MC for a very short time, the applied program current I causes only an adjacent membrane of the lower electrode 13 to be heated by Joule's heat. In this case, a portion of the phase change layer 11 is in the crystalline state (or the set state) or the amorphous state (or the reset state) by a difference in a heating profile.

Figure 4:
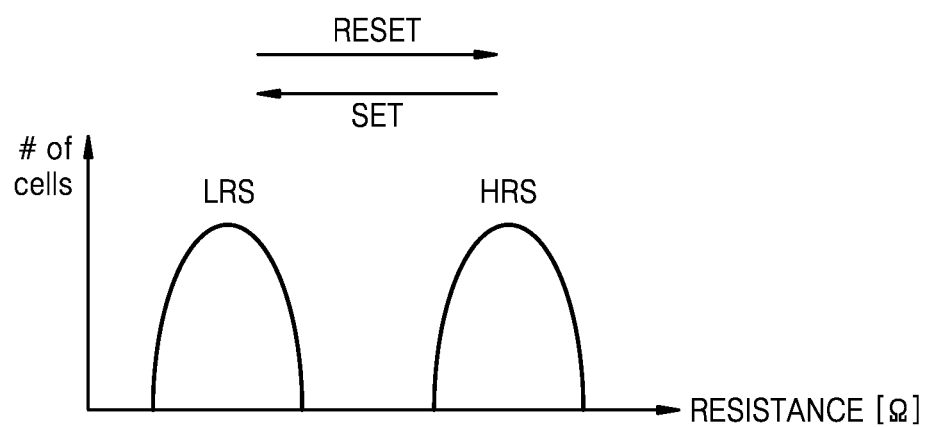
FIG. 4 is a graph illustrating resistance distribution of memory cells, according to an embodiment of the inventive concept.

FIG. 4 is a graph illustrating resistance distribution of memory cells, according to an embodiment of the inventive concept.

Referring to FIG. 4, a horizontal axis indicates resistance, and a vertical axis indicates the number of memory cells MC. For example, when the memory cell MC is an SLC to be programmed to one bit, the memory cell MC may have a low-resistance state LRS or a high-resistance state HRS. The LRS and the HRS may correspond to any one of data '0' and data '1'. According to an embodiment, a resistance level R may increase in the order from data '0' to data '1'. That is, the LRS may correspond to data '0', and the HRS may correspond to data '1'.

An operation of switching the memory cell MC from the HRS to the LRS by applying a program current to the memory cell MC is referred to as a set operation or a set write operation. In addition, an operation of switching the memory cell MC from the LRS to the HRS by applying a program current to the memory cell MC is referred to as a reset operation or a reset write operation.

Figure 5:
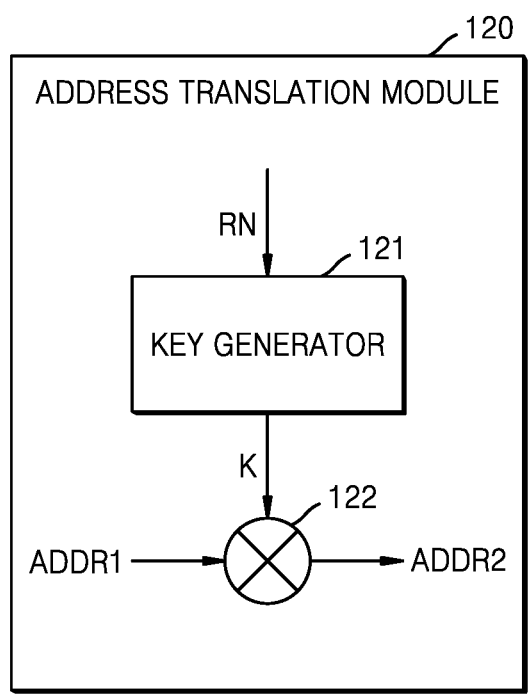
FIG. 5 is a block diagram of an address translation module according to an embodiment of the inventive concept.

FIG. 5 is a block diagram of the address translation module 120 according to an embodiment of the inventive concept.

Referring to FIGS. 1 and 5, the address translation module 120 may include a key generator 121 and a translator 122. The key generator 121 may receive the random number RN from the random number generator 110 and generate a key K from the received random number RN. According to an embodiment, the key K may be the same as the random number RN. According to some embodiments, the address translation module 120 may not include the key generator 121. However, the inventive concept is not limited thereto, and the key K may differ from the random number RN. The translator 122 may translate the first address ADDR1 into the second address ADDR2 by performing a calculation on the first address ADDR1 and the key K. According to an embodiment, the translator 122 may perform an XOR operation on the first address ADDR1 and the key K. In this case, the number of bits of each of the first and second addresses ADDR1 and ADDR2 may be the same as the number of bits of the key K.

Figure 6:
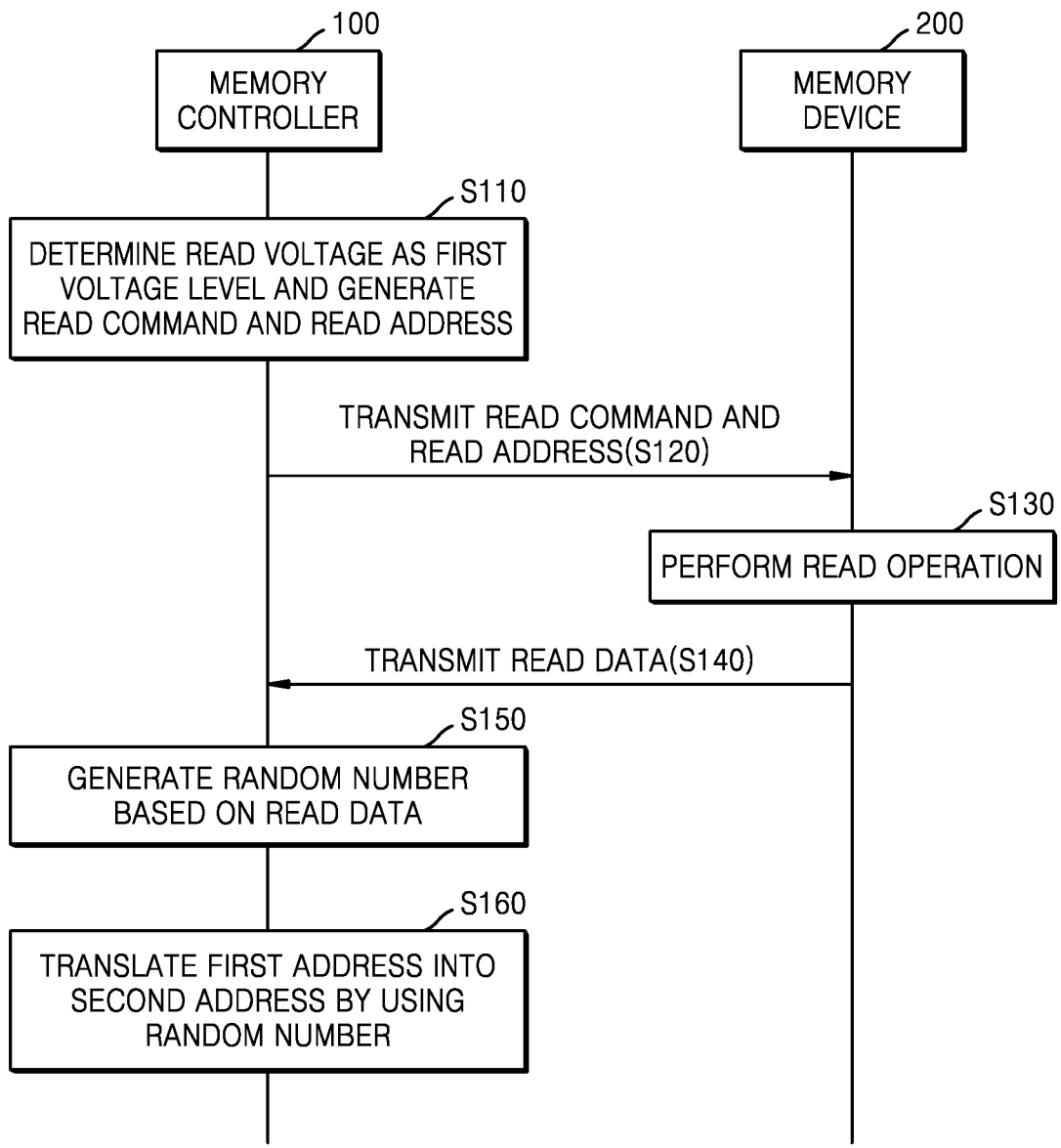
FIG. 6 is a signaling diagram of operations of a memory controller and a memory device, according to an embodiment of the inventive concept.
Figure 7A:
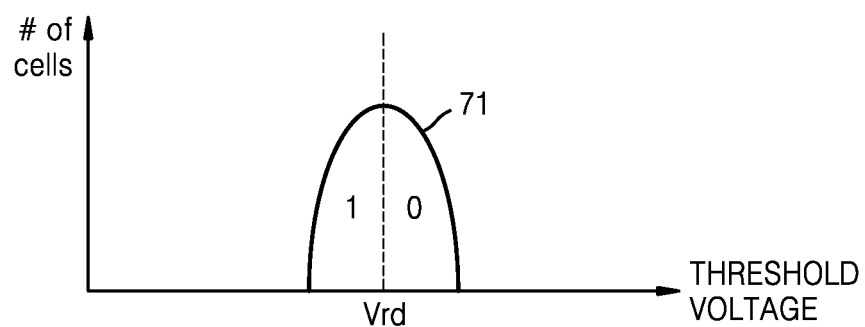
FIG. 7A is a graph illustrating an example of a read operation according to the embodiment of FIG. 6.
Figure 7B:
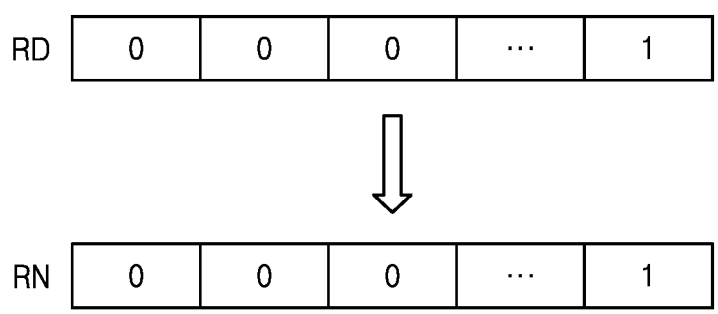
FIG. 7B illustrates an example of a random number generation operation according to the embodiment of FIG. 6.

FIG. 6 is a signaling diagram of operations of the memory controller 100 and the memory device 200, according to an embodiment of the inventive concept. FIG. 7A is a graph illustrating an example of a read operation according to the embodiment of FIG. 6, and FIG. 7B illustrates an example of a random number generation operation according to the embodiment of FIG. 6. Hereinafter, a description will be made with reference to FIGS. 1 and 6, 7A, and 7B.

In operation S110, the memory controller 100 determines a read voltage as a first voltage level Vrd and generates a read command and a read address. For example, the read/write control module 130 may determine a read voltage as the first voltage level Vrd. The read address may correspond to a plurality of memory cells included in a partial region of the memory cell array 210. According to an embodiment, the memory cell array 210 may include a memory region for performing a read operation needed for random number generation, and the read address may correspond to a plurality of memory cells included in the memory region.

In operation S120, the memory controller 100 transmits the read command and the read address to the memory device 200. In this case, the memory controller 100 may transmit determined read voltage information together with the read command to the memory device 200. In operation S130, the memory device 200 performs a read operation and generates the read data RD. In detail, the memory device 200 may perform a read operation on a plurality of memory cells corresponding to the read address by using the first voltage level Vrd. The plurality of memory cells may have a distribution 71 according to threshold voltages, wherein a read result for memory cells having threshold voltages higher than the first voltage level Vrd may be "0", and a read result for memory cells having threshold voltages lower than the first voltage level Vrd may be "1". It will be appreciated that the memory controller 100 may have previously instructed a write operation to be performed on the plurality of memory cells corresponding to the read address.

In operation S140, the memory device 200 transmits the read data RD to the memory controller 100. For example, the read data RD may be "000 . . . 1" and include N bits. In operation S150, the memory controller 100 generates the random number RN based on the read data RD. For example, the random number RN may be "000 . . . 1" and include M bits. According to an embodiment, N and M may be the same positive integer. However, the inventive concept is not limited thereto, and N and M may be different positive integers. According to an embodiment, the random number RN may be the same as the read data RD. However, the inventive concept is not limited thereto, and according to some embodiments, the random number RN may differ from the read data RD. In operation S160, the memory controller 100 translates the first address ADDR1 into the second address ADDR2 by using the random number RN.

Figure 8:
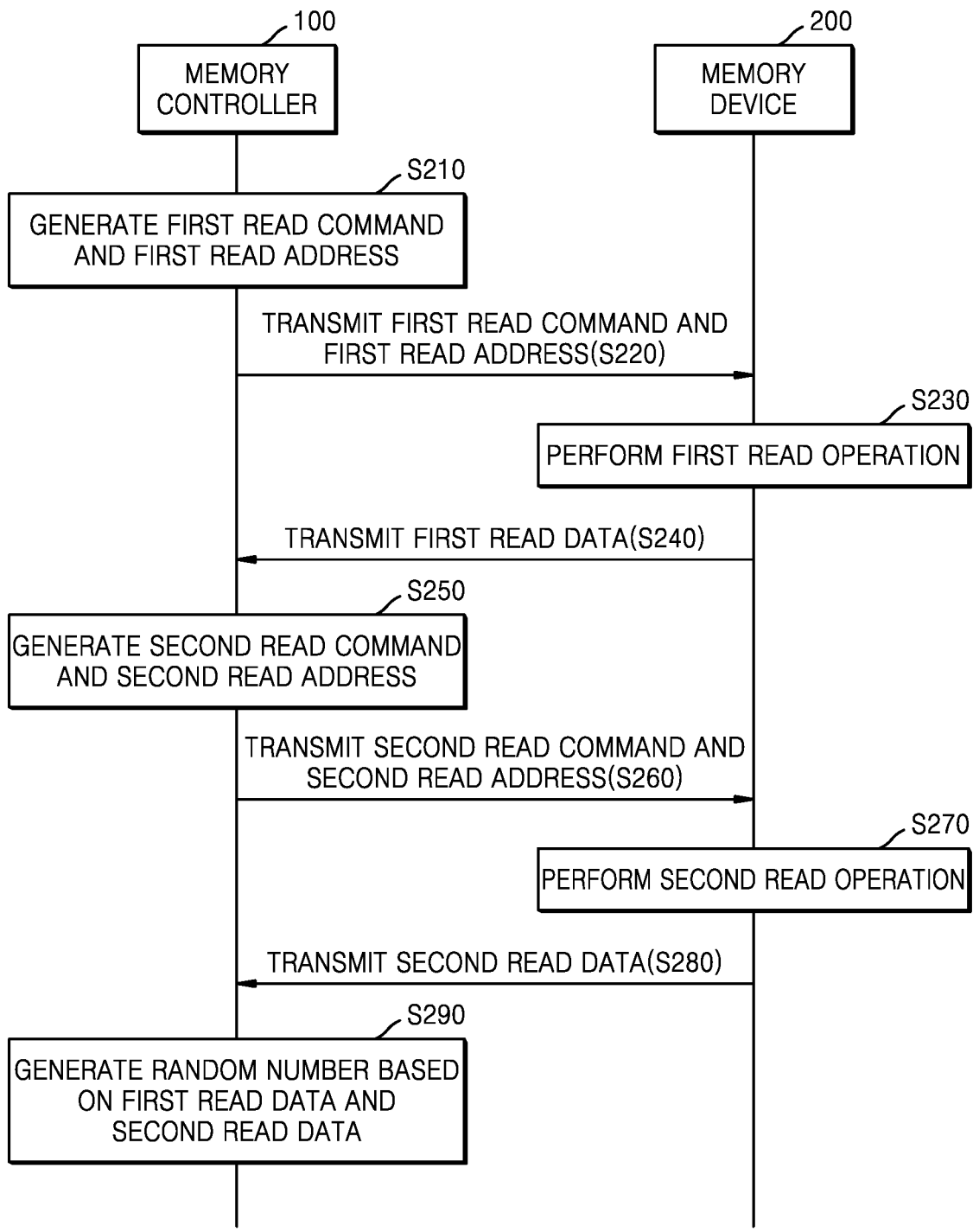
FIG. 8 is a signaling diagram of operations of the memory controller and the memory device, according to an embodiment of the inventive concept.
Figure 9A:
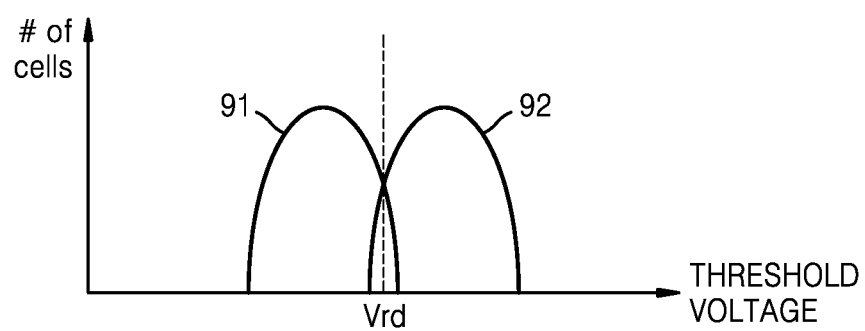
FIG. 9A is a graph illustrating an example of a read operation according to the embodiment of FIG. 8.
Figure 9B:
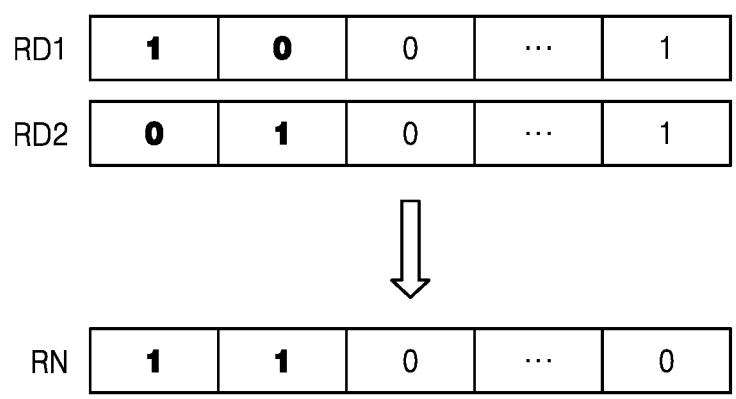
FIG. 9B illustrates an example of a random number generation operation according to the embodiment of FIG. 8.

FIG. 8 is a signaling diagram of operations of the memory controller 100 and the memory device 200, according to an embodiment of the inventive concept. FIG. 9A is a graph illustrating an example of a read operation according to the embodiment of FIG. 8, and FIG. 9B illustrates an example of a random number generation operation according to the embodiment of FIG. 8. Hereinafter, a description will be made with reference to FIGS. 1 and 8, 9A, and 9B.

In operation S210, the memory controller 100 generates a first read command and a first read address. For example, the first read address may correspond to first memory cells included in the memory cell array 210. In operation S220, the memory controller 100 transmits the first read command and the first read address to the memory device 200. In operation S230, the memory device 200 performs a first read operation with respect to the first read address and generates first read data.

In detail, the memory device 200 may perform a read operation on the first memory cells by using the first voltage level Vrd. The first memory cells may have a first distribution 91 according to threshold voltages, wherein a read result for memory cells having threshold voltages higher than the first voltage level Vrd may be "0", and a read result for memory cells having threshold voltages lower than the first voltage level Vrd may be "1". In operation S240, the memory device 200 transmits first read data RD1 to the memory controller 100. For example, the first read data RD1 may be "100 . . . 1" and include N bits.

In operation S250, the memory controller 100 generates a second read command and a second read address. For example, the second read address may correspond to second memory cells included in the memory cell array 210. According to an embodiment, the first memory cells may be the same as the second memory cells. Accordingly, the first read address may be the same as the second read address. When a first read operation and a second read operation are sequentially performed with respect to the same address, the first read data RD1 may differ from second read data RD2. However, the inventive concept is not limited thereto, and the first read address may differ from the second read address.

In operation S260, the memory controller 100 transmits the second read command and the second read address to the memory device 200. In operation S270, the memory device 200 performs the second read operation with respect to the second read address and generates the second read data RD2. In detail, the memory device 200 may perform a read operation on the plurality of second memory cells by using the first voltage level Vrd. The plurality of second memory cells may have a second distribution 92 according to threshold voltages, wherein a read result for memory cells having threshold voltages higher than the first voltage level Vrd may be "0", and a read result for memory cells having threshold voltages lower than the first voltage level Vrd may be "1". In operation S280, the memory device 200 transmits the second read data RD2 to the memory controller 100. For example, the second read data RD2 may be "010 . . . 1" and include N bits.

In operation S290, the memory controller 100 generates the random number RN by using the first read data RD1 and the second read data RD2. According to an embodiment, the memory controller 100 may compare the first read data RD1 with the second read data RD2. In detail, the memory controller 100 may compare bits of the first read data RD1 with bits of the second read data RD2, respectively. Thereafter, the memory controller 100 may determine whether a flip bit occurs or a number of flip bits based on a comparison result.

For example, the most significant bit of the first read data RD1 may be "1", the most significant bit of the second read data RD2 may be "0", and accordingly, it may be determined that a flip bit has occurred in the most significant bit. For example, the second most significant bit of the first read data RD1 may be "0", the second most significant bit of the second read data RD2 may be "1", and accordingly, it may be determined that a flip bit has occurred in the second most significant bit. Thereafter, the memory controller 100 may generate the random number RN based on whether a flip bit occurs or the number of flip bits. For example, the random number RN may be "110 . . . 0" and include N bits.

Figure 10:
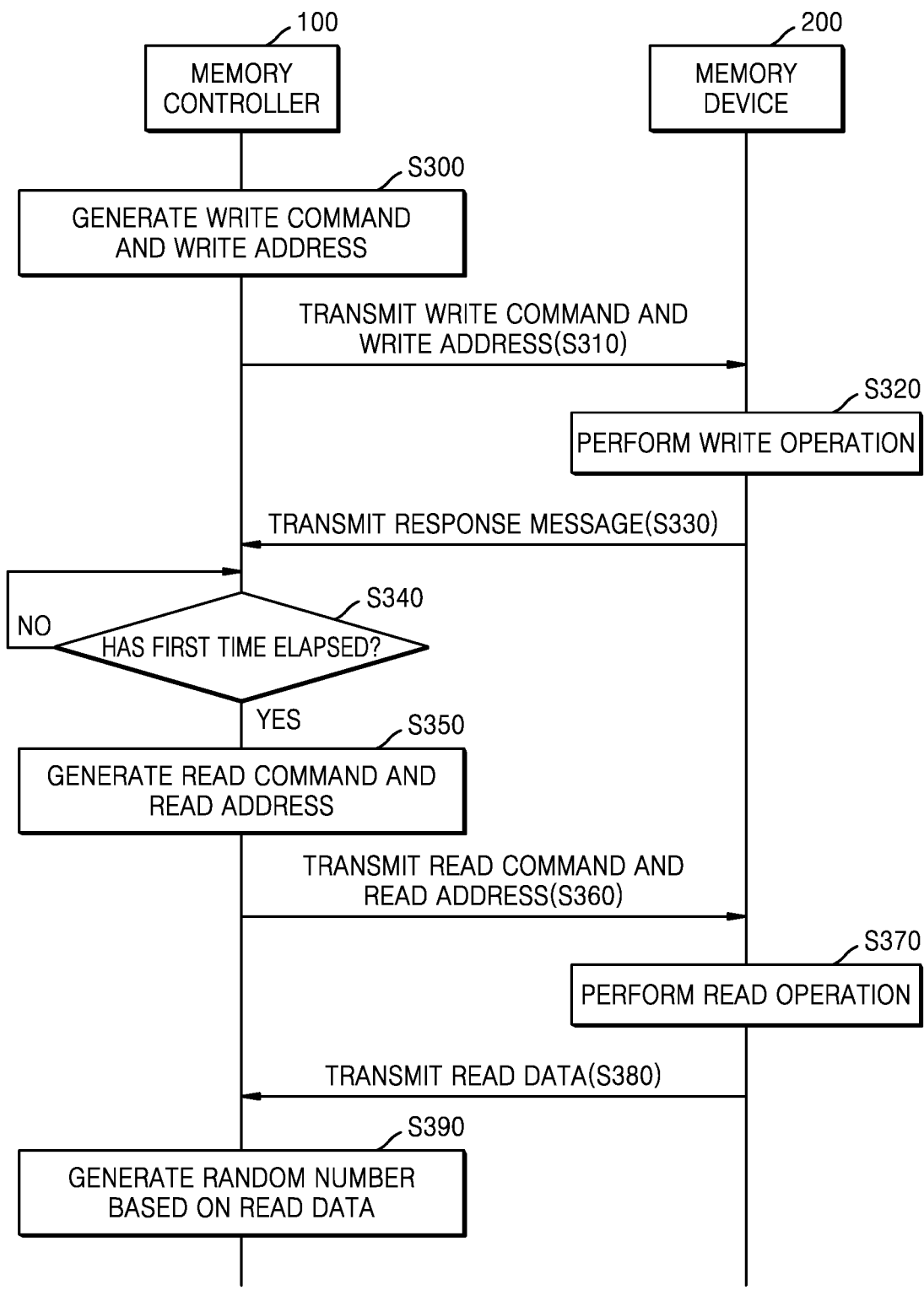
FIG. 10 is a signaling diagram of operations of the memory controller and the memory device, according to an embodiment of the inventive concept.
Figure 11:
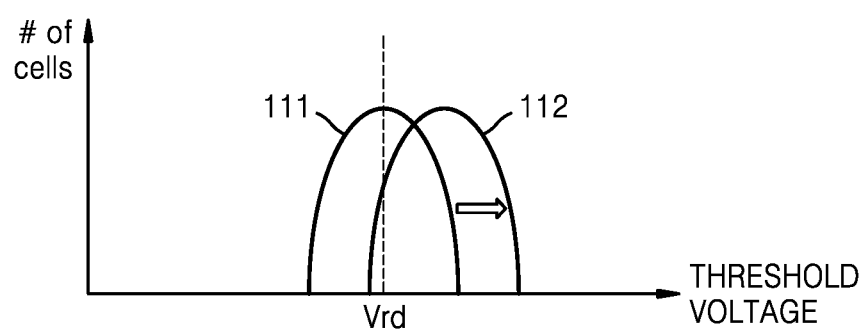
FIG. 11 is a graph illustrating an example of a read operation according to the embodiment of FIG. 10.

FIG. 10 is a signaling diagram of operations of the memory controller 100 and the memory device 200, according to an embodiment of the inventive concept. FIG. 11 is a graph illustrating an example of a read operation according to the embodiment of FIG. 10. Hereinafter, a description will be made with reference to FIGS. 1, 10, and 11.

In operation S300, the memory controller 100 generates a write command and a write address. For example, the read/write control module 130 may generate the write command, the write address, and write data. The write address may correspond to memory cells include in a partial region of the memory cell array 210. According to an embodiment, the memory cell array 210 may include a memory region for performing a read operation needed for random number generation, and the write address may correspond to memory cells included in the memory region. In operation S310, the memory controller 100 transmits the write command and the write address to the memory device 200. In operation S320, the memory device 200 performs a write operation with respect to the write address. In operation S330, the memory device 200 transmits, to the memory controller 100, a response message indicating that the write operation has been finished.

In operation S340, the memory controller 100 determines whether a first time has elapsed. In detail, the memory controller 100 may determine whether the first time has elapsed from a first time point at which the write operation has been finished. For example, the first time point may correspond to a time point at which the response message is received from the memory device 200. As a result of the determination, when the first time has elapsed, the present process proceeds to operation S350, and otherwise, the present process proceeds back to operation S340. A plurality of memory cells on which the write operation has been finished may have a first distribution 111 according to threshold voltages, and once the first time elapses, the first distribution 111 according to the threshold voltages of the plurality of memory cells may be changed to a second distribution 112.

In operation S350, the memory controller 100 generates a read command and a read address. For example, the read address may be the same as the write address. In operation S360, the memory controller 100 transmits the read command and the read address to the memory device 200. In operation S370, the memory device 200 performs a read operation with respect to the read address and generates the read data RD. In detail, the memory device 200 may perform a read operation on the memory cells by using the first voltage level Vrd. In operation S380, the memory device 200 transmits the read data RD to the memory controller 100.

In operation S390, the memory controller 100 generates the random number RN based on the read data RD. According to an embodiment, operation S390 may be performed similarly to operation S150 of FIG. 6 and in this case, operations corresponding to operations S110 to S140 of FIG. 6 may be performed between operations S350 and S380. According to an embodiment, operation S390 may be performed similarly to operation S290 of FIG. 8, and in this case, operations corresponding to operations S250 to S280 of FIG. 8 may be performed between operations S350 and S380.

Figure 12:
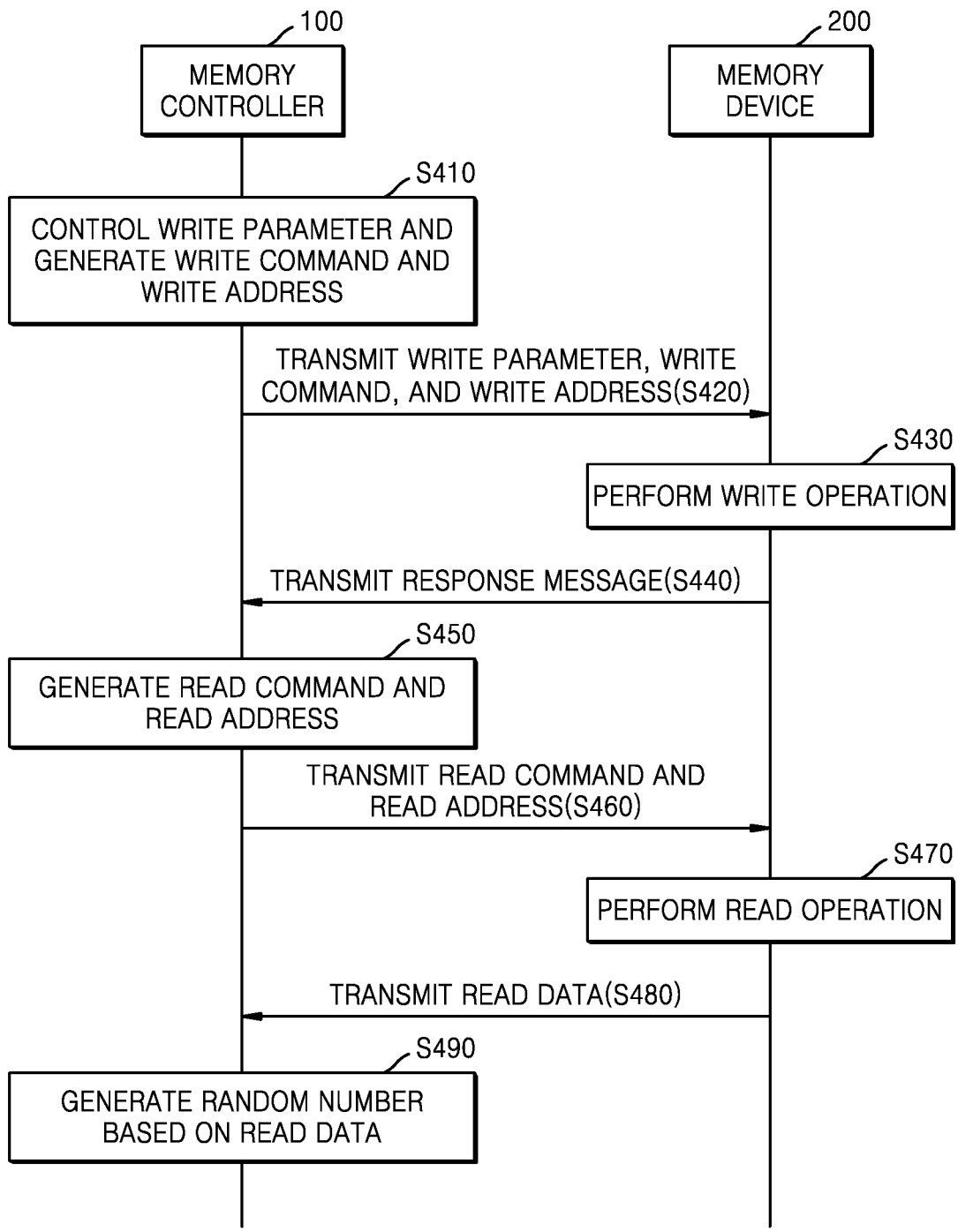
FIG. 12 is a signaling diagram of operations of the memory controller and the memory device, according to an embodiment of the inventive concept.
Figure 13:
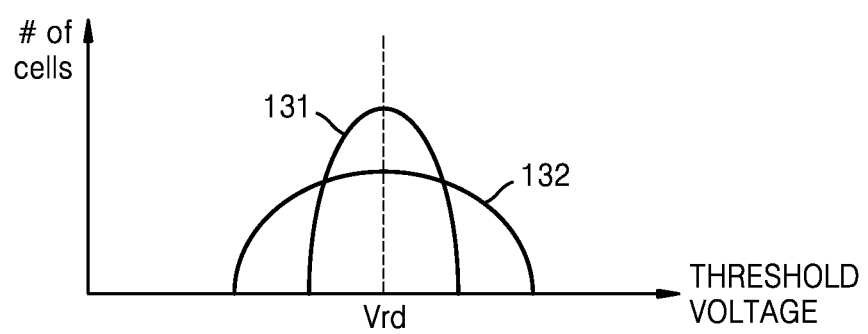
FIG. 13 is a graph illustrating an example of a read operation according to the embodiment of FIG. 12.

FIG. 12 is a signaling diagram of operations of the memory controller 100 and the memory device 200, according to an embodiment of the inventive concept. FIG. 13 is a graph illustrating an example of a read operation according to the embodiment of FIG. 12. Hereinafter, a description will be made with reference to FIGS. 1, 12, and 13.

In operation S410, the memory controller 100 controls a write parameter and generates a write command and a write address. For example, the read/write control module 130 may control the write parameter such as a set current or a reset voltage. The write address may correspond to memory cells included in a partial region of the memory cell array 210. In operation S420, the memory controller 100 transmits the write parameter, the write command, and the write address to the memory device 200. In operation S430, the memory device 200 performs a write operation with respect to the write address by using the write parameter. In operation S440, the memory device 200 transmits, to the memory controller 100, a response message indicating that the write operation has been finished.

When a normal write operation on user data is performed, memory cells programmed in the first program state may have a first distribution 131. However, according to the present embodiment, when a write operation is performed by using a changed write parameter, the memory cells programmed in the first program state may have a second distribution 132. A read result for the memory cells having the second distribution 132 may be more random than a read result for the memory cells having the first distribution 131. As described above, the read/write control module 130 may control the write parameter such that the read data RD to be used for random number generation is more random.

According to an embodiment, operations S410 to S440 may be performed before the memory device 200 or the memory system 10 is released to the market. In other words, a write operation on memory cells from which data is to be read to generate the random number RN may be performed before a product is released to the market. According to an embodiment, operations S410 to S440 may be performed after the memory device 200 or the memory system 10 is released to the market. For example, a write operation on memory cells from which data is to be read to generate the random number RN may be performed in the middle of the use of a product.

In operation S450, the memory controller 100 generates a read command and a read address. For example, the read address may be the same as the write address. In operation S460, the memory controller 100 transmits the read command and the read address to the memory device 200. In operation S470, the memory device 200 performs a read operation with respect to the read address and generates the read data RD. In detail, the memory device 200 may perform a read operation on memory cells by using the first voltage level Vrd. In operation S480, the memory device 200 transmits the read data RD to the memory controller 100.

In operation S490, the memory controller 100 generates the random number RN based on the read data RD. According to an embodiment, operation S490 may be performed similarly to operation S150 of FIG. 6 and in this case, operations corresponding to operations S110 to S140 of FIG. 6 may be performed between operations S450 and S480. According to an embodiment, operation S490 may be performed similarly to operation S290 of FIG. 8, and in this case, operations corresponding to operations S250 to S280 of FIG. 8 may be performed between operations S450 and S480.

FIG. 14 is a signaling diagram of operations of the memory controller 100 and the memory device 200, according to an embodiment of the inventive concept.

Referring to FIGS. 1 and 14, in operation S500, the memory controller 100 generates a first write command and a first write address for first memory cells. The first write address may correspond to the first memory cells. In operation S510, the memory controller 100 transmits the first write command and the first write address to the memory device 200. In operation S520, the memory device 200 performs a first write operation with respect to the first write address. In operation S525, the memory device 200 transmits, to the memory controller 100, a response message indicating that the first write operation has been finished.

In operation S530, the memory controller 100 generates a second write command and a second write address for second memory cells. The second write address may correspond to the second memory cells. Herein, the second memory cells may be arranged around the first memory cells. In operation S540, the memory controller 100 transmits the second write command and the second write address to the memory device 200. In operation S550, the memory device 200 performs a second write operation with respect to the second write address. A distribution of the first memory cells may be changed due to program disturbance caused by performing the second write operation. In operation S555, the memory device 200 transmits, to the memory controller 100, a response message indicating that the second write operation has been finished.

In operation S560, the memory controller 100 generates a read command and a read address for the first memory cells. For example, the read address may be the same as the first write address. In operation S570, the memory controller 100 transmits the read command and the read address to the memory device 200. In operation S580, the memory device 200 performs a read operation with respect to the read address and generates the read data RD. In operation S585, the memory device 200 transmits the read data RD to the memory controller 100.

According to an embodiment, operations S500 to S555 may be performed before the memory device 200 or the memory system 10 is released to the market. In other words, a write operation on memory cells from which data is to be read to generate the random number RN may be performed before a product is released to the market. According to an embodiment, operations S500 to S555 may be performed after the memory device 200 or the memory system 10 is released to the market. For example, a write operation on memory cells from which data is to be read to generate the random number RN may be performed in the middle of the use of a product.

In operation S590, the memory controller 100 generates the random number RN based on the read data RD. According to an embodiment, operation S590 may be performed similarly to operation S150 of FIG. 6 and in this case, operations corresponding to operations S110 to S140 of FIG. 6 may be performed between operations S560 and S585. According to an embodiment, operation S590 may be performed similarly to operation S290 of FIG. 8, and in this case, operations corresponding to operations S250 to S280 of FIG. 8 may be performed between operations S560 and S585.

Figures 15A, 15B:
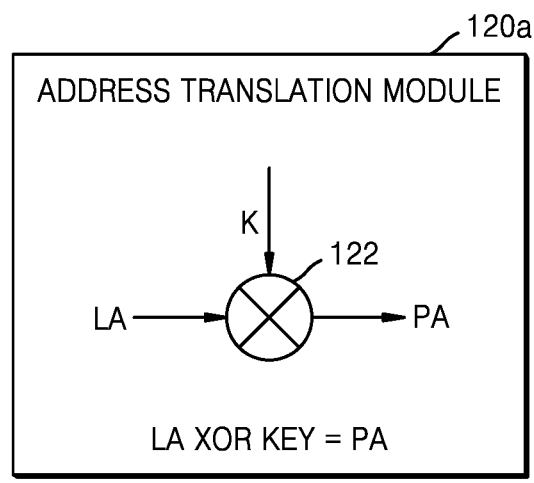
FIG. 15A is a block diagram of an address translation module according to an embodiment of the inventive concept.
FIG. 15B illustrates a mapping table generated according to an operation of the address translation module of FIG. 15A.

FIG. 15A is a block diagram of an address translation module 120a according to an embodiment of the inventive concept.

Referring to FIG. 15A, the address translation module 120a may include the translator 122, and the translator 122 may translate a logical address LA into a physical address PA by performing a calculation on the logical address LA received from a host and the key K. In this case, the key K may be named "mapping key". For example, the translator 122 may generate the physical address PA by performing an XOR operation on the logical address LA and the key K. In this case, the number of bits of each of the logical address LA and the physical address PA may be the same as the number of bits of the key K.

The key K may be generated by using read data received from a memory device. For example, the key K may correspond to the read data. In addition, the key K may have a size corresponding to a size of the logical address LA. For example, when the logical address LA has N bits, the key K may also have N bits. According to some embodiments, the address translation module 120a may further include the key generator 121 of FIG. 5.

FIG. 15B illustrates a mapping table MTa generated according to an operation of the address translation module 120a of FIG. 15A.

Referring to FIG. 15B, the mapping table MTa may store mapping information between the logical address LA and the physical address PA. For example, the address translation module 120a may generate a physical address PAa by performing an XOR operation on a logical address LA1 and the key K. For example, the address translation module 120a may generate a physical address PAb by performing an XOR operation on a logical address LA2 and the key K. In a read operation, when an input address (e.g., a logical address) from a host is stored in the mapping table MTa, the input address may be translated to a corresponding physical address to read data from memory cells corresponding to the physical address.

According to an embodiment, the physical address PAa and the physical address PAb may belong to different blocks, respectively. According to an embodiment, the physical address PAa and the physical address PAb may belong to different memory chips, respectively. As described above, according to the present embodiment, the memory controller 100 may randomly assign physical addresses for writing data in the memory device 200, thereby reducing the occurrence of local wear-out in the memory device 200 and performing wear leveling.

Figure 16:
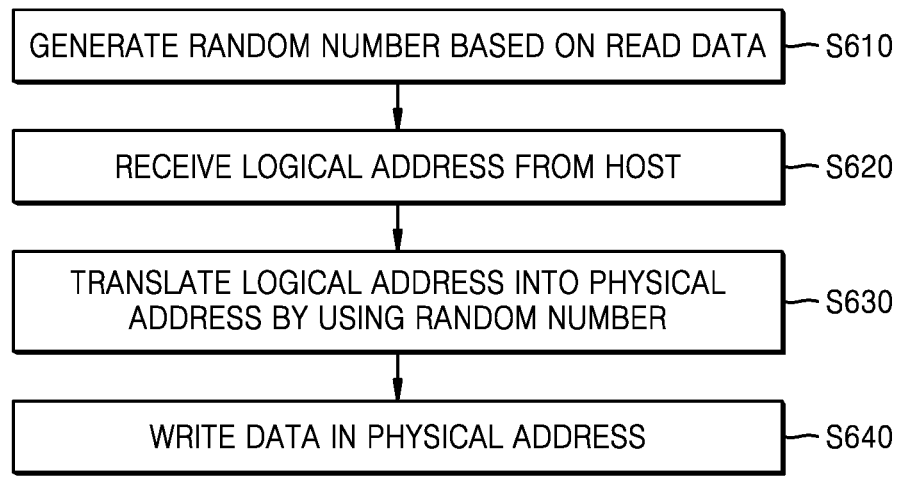
FIG. 16 is a flowchart of an operating method of the memory controller, according to an embodiment of the inventive concept.

FIG. 16 is a flowchart of an operating method of the memory controller 100, according to an embodiment of the inventive concept.

Referring to FIGS. 1, 15A, 15B, and 16, in operation S610, the memory controller 100 generates the random number RN based on the read data RD. According to some embodiments, the random number RN may be determined differently for each page, block, or chip of the memory device 200. In this case, random numbers RN determined differently for pages, blocks, or chips of the memory device 200 may be stored in the mapping table MTa. In operation S620, the memory controller 100 receives the logical address LA from a host. According to some embodiments, operation S610 may be performed after operation S620.

In operation S630, the memory controller 100 translates the logical address LA into the physical address PA by using the random number RN. In this case, the memory controller 100 stores mapping information between the logical address LA and the physical address PA in the mapping table MTa. In operation S640, the memory controller 100 writes data in memory cells corresponding to the physical address PA.

As described above, endurance of the memory device 200 may be improved by randomly assigning the physical address PA for accessing the memory device 200. In addition, security of a memory system using algebraic mapping may be reinforced by randomly generating the key K, i.e., a mapping key, for translating the logical address LA into the physical address PA.

Figure 17A:
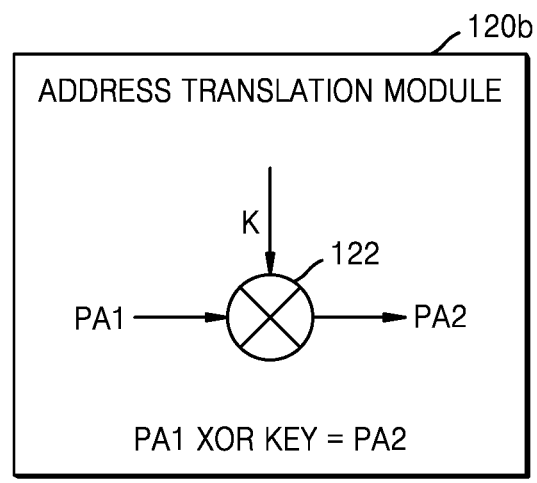
FIG. 17A is a block diagram of an address translation module according to an embodiment of the inventive concept.

FIG. 17A is a block diagram of an address translation module 120b according to an embodiment of the inventive concept.

Referring to FIG. 17A, the address translation module 120b may include the translator 122, and the translator 122 may translate a first physical address PA1 into a second physical address PA2 by performing a calculation on the first physical address PA1 and the key K. In this case, the key K may be named "remapping key". For example, the translator 122 may generate the second physical address PA2 by performing an XOR operation on the first physical address PA1 and the key K. as described above, the address translation module 120b translates an original physical address (i.e., the first physical address PA1) into a new physical address (i.e., the second physical address PA2), and thus, the address translation module 120b may be named "address remapping module" or "address remapper". In some examples, the first physical address PA1 may be generated based on a logical address LA received from a host.

The key K may be generated by using read data received from a memory device. For example, the key K may be "01". For example, the key K may correspond to the read data. In addition, the key K may have a size corresponding to a size of the first physical address PA1. For example, when the first physical address PA1 has two bits, the key K may also have two bits. According to some embodiments, the address translation module 120b may further include the key generator 121 of FIG. 5.

Figure 17B:
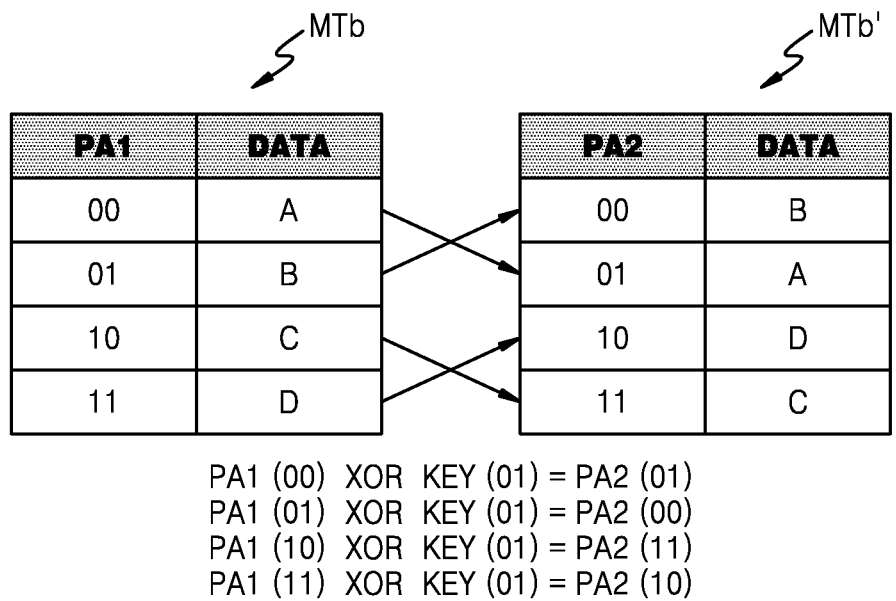
FIG. 17B illustrates a mapping table generated according to an operation of the address translation module of FIG. 17A.

FIG. 17B illustrates a mapping table MTb generated according to an operation of the address translation module 120b of FIG. 17A.

Referring to FIG. 17B, the mapping table MTb may store mapping information between the logical address LA and the first physical address PA1. In FIG. 17B, the logical address LA is omitted for convenience of description to focus on the first and second physical addresses PA1 and PA2. In addition, the mapping table MTb may further store information on data stored in the first physical address PA1. For example, the first physical address PA1 in which data A is stored may be "00", the first physical address PA1 in which data B is stored may be "01", the first physical address PA1 in which data C is stored may be "10", and the first physical address PA1 in which data D is stored may be "11".

The address translation module 120b may generate the second physical address PA2 by performing an XOR operation on the first physical address PA1 and the key K. For example, the address translation module 120b may generate the second physical address PA2 as "01" by performing an XOR operation on the first physical address PA1, "00", and the key K, "01". According to an embodiment, the first physical address PA1 and the second physical address PA2 may belong to the same block. Accordingly, unequal wear-out of one page included in the same block may be prevented, and degrees of wear of a plurality of pages included in the same block may be equalized.

However, the inventive concept is not limited thereto, and according to some embodiments, the first physical address PA1 and the second physical address PA2 may belong to different blocks, respectively. Accordingly, unequal wear-out of one block included in the same chip may be prevented, and degrees of wear of a plurality of blocks included in the same chip may be equalized. In addition, according to some embodiments, the first physical address PA1 and the second physical address PA2 may belong to different chips, respectively. Accordingly, unequal wear-out of one chip may be prevented, and degrees of wear of a plurality of chips may be equalized. As described above, according to the present embodiment, the memory controller 100 may randomly assign physical addresses for writing data in the memory device 200, thereby reducing the occurrence of local wear-out in the memory device 200 and performing wear leveling.

Figure 18:
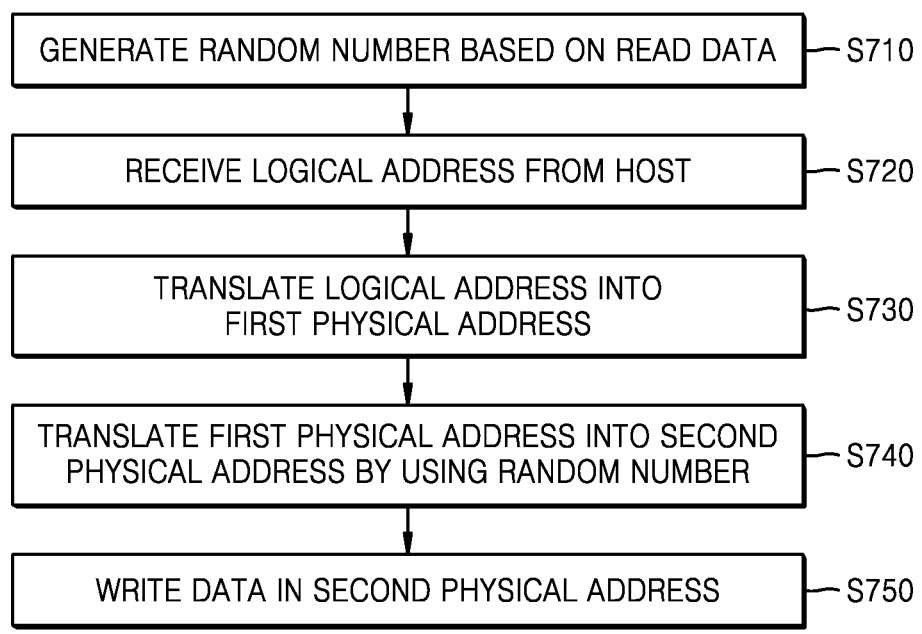
FIG. 18 is a flowchart of an operating method of the memory controller, according to an embodiment of the inventive concept.

FIG. 18 is a flowchart of an operating method of the memory controller 100, according to an embodiment of the inventive concept.

Referring to FIGS. 1, 17A, 17B, and 18, in operation S710, the memory controller 100 generates the random number RN based on the read data RD. According to some embodiments, the random number RN may be determined differently for each page, block, or chip of the memory device 200. In this case, random numbers RN determined differently for pages, blocks, or chips of the memory device 200 may be stored in the mapping table MTb. In operation S720, the memory controller 100 receives the logical address LA from a host. However, the inventive concept is not limited thereto, and according to some embodiments, a sequence of operations S710 and S720 may be changed. For example, operation S720 may be performed prior to operation S710. In operation S730, the memory controller 100 translates the logical address LA into the first physical address PA1. In this case, the memory controller 100 may store mapping information between the logical address LA and the first physical address PA1 in the mapping table MTb. According to some embodiments, operation S710 may be performed after operation S720 or S730.

In operation S740, the memory controller 100 translates the first physical address PA1 into the second physical address PA2 by using the random number RN. For example, the memory controller 100 may generate the second physical address PA2 by performing an XOR operation on the first physical address PA1 and the random number RN. In this case, the memory controller 100 may store mapping information between the logical address LA and the second physical address PA2 in a mapping table MTb'. In operation S750, the memory controller 100 writes data in memory cells corresponding to the second physical address PA2.

As described above, endurance of the memory device 200 may be improved by randomly assigning the second physical address PA2 for accessing the memory device 200. In addition, security of a memory system using algebraic mapping may be further reinforced by randomly generating the key K, i.e., a remapping key, for translating the first physical address PA1 into the second physical address PA2.

Figure 19:
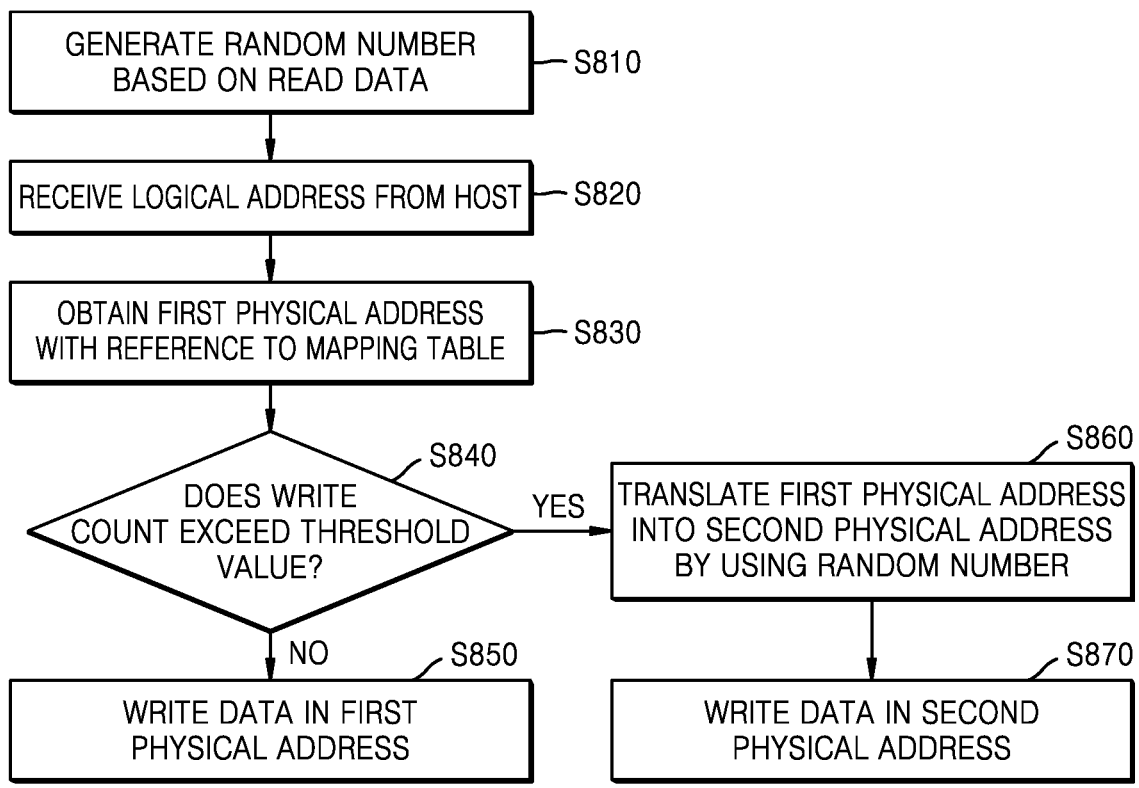
FIG. 19 is a flowchart of an operating method of the memory controller, according to an embodiment of the inventive concept.

FIG. 19 is a flowchart of an operating method of the memory controller 100, according to an embodiment of the inventive concept. The operating method of the memory controller 100, according to the present embodiment, may correspond to one implementation example of the operating method of FIG. 18.

Referring to FIGS. 1, 17A, 17B, and 19, in operation S810, the memory controller 100 generates the random number RN based on the read data RD. According to some embodiments, the random number RN may be determined differently for each page, block, or chip of the memory device 200. In this case, random numbers RN determined differently for pages, blocks, or chips of the memory device 200 may be stored in the mapping table MTb. In operation S820, the memory controller 100 receives a logical address from a host. However, the inventive concept is not limited thereto, and according to some embodiments, a sequence of operations S810 and S820 may be changed. In other words, operation S820 may be performed prior to operation S810. In operation S830, the memory controller 100 obtains the first physical address PA1 corresponding to the logical address by referring to the mapping table MTb. According to some embodiments, operation S810 may be performed after operation S820 or S830.

In operation S840, the memory controller 100 determines whether a write count exceeds a threshold value. According to an embodiment, the memory controller 100 may manage the write count for each block within a predetermined period. According to an embodiment, the memory controller 100 may manage the write count for each page within a predetermined period. According to an embodiment, the memory controller 100 may manage the write count for each chip within a predetermined period. When the write count is less than the threshold value as a result of the determination, the memory controller 100 writes data in memory cells corresponding to the first physical address PA1 in operation S850.

Otherwise, when the write count exceeds the threshold value as the result of the determination, the memory controller 100 translates the first physical address PA1 into the second physical address PA2 by using the random number RN in operation S860. For example, the memory controller 100 may generate the second physical address PA2 by performing an XOR operation on the first physical address PA1 and the random number RN. In this case, the memory controller 100 may update information on the second physical address PA2 in the mapping table MTb'. In operation S870, the memory controller 100 writes data in memory cells corresponding to the second physical address PA2.

Figure 20:
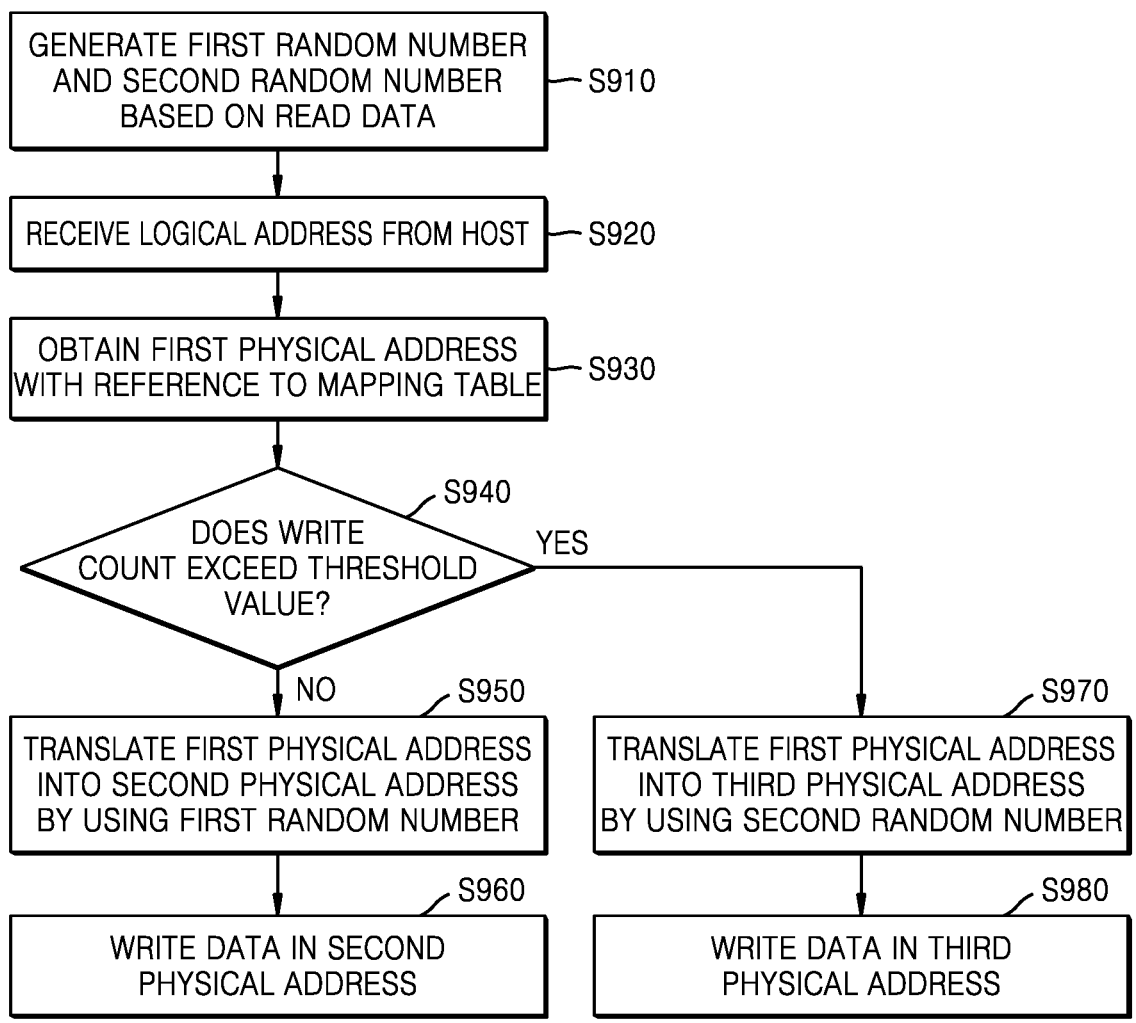
FIG. 20 is a flowchart of an operating method of the memory controller, according to an embodiment of the inventive concept.
Figure 21:
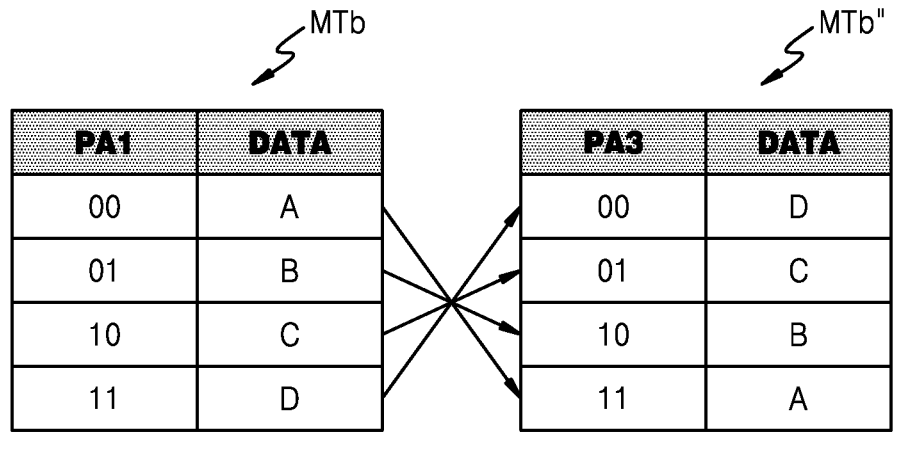
FIG. 21 illustrates an example of a mapping table generated according to an operation of an address translation module of FIG. 20.

FIG. 20 is a flowchart of an operating method of the memory controller 100, according to an embodiment of the inventive concept. FIG. 21 illustrates an example of a mapping table generated according to an operation of an address translation module of FIG. 20. The operating method of the memory controller 100, according to the present embodiment, may correspond to one implementation example of the operating method of FIG. 18. Hereinafter, the operating method of the memory controller 100 will be described with reference to FIGS. 1, 17A, 17B, 20, and 21.

In operation S910, the memory controller 100 generates first and second random numbers based on the read data RD. According to an embodiment, the memory controller 100 may sequentially perform a first read operation and a second read operation on the memory device 200, and accordingly, sequentially receive first read data and second read data. According to an embodiment, the memory controller 100 may perform a read operation on the memory device 200, and accordingly, determine a portion of read data as the first read data and the other portion of the read data as the second read data. The memory controller 100 may generate the first random number based on the first read data and generate the second random number based on the second read data. However, the inventive concept is not limited thereto, and according to some embodiments, an operation of generating the second random number may be performed after operation S920, e.g., after operation S940.

In operation S920, the memory controller 100 receives a logical address from a host. However, the inventive concept is not limited thereto, and according to some embodiments, a sequence of operations S910 and S920 may be changed. In other words, operation S920 may be performed prior to operation S910. In operation S930, the memory controller 100 obtains the first physical address PA1 corresponding to the logical address by referring to the mapping table MTb. In operation S940, the memory controller 100 determines whether a write count exceeds a threshold value. When the write count is less than the threshold value as a result of the determination, the memory controller 100 translates the first physical address PA1 (e.g., "00") into the second physical address PA2 (e.g., "01") by using the first random number in operation S950. In operation S960, the memory controller 100 writes data in memory cells corresponding to the second physical address PA2.

Otherwise, when the write count exceeds the threshold value as the result of the determination, the memory controller 100 translates the first physical address PA1 into a third physical address PA3 by using the second random number in operation S970. For example, the address translation module 120b may generate the third physical address PA3 as "11" by performing an XOR operation on the first physical address PA1, "00", and the key K, "11". Accordingly, the third physical address PA3 in which the data A is to be written may be determined as "11". For example, the address translation module 120b may generate the third physical address PA3 as "00" by performing an XOR operation on the first physical address PA1, "11", and the key K, "11". Accordingly, the third physical address PA3 in which the data D is to be written may be determined as "00". In this case, the memory controller 100 may update information on the third physical address PA3 in a mapping table MTb". In operation S980, the memory controller 100 writes data in memory cells corresponding to the third physical address PA3.

Figure 22:
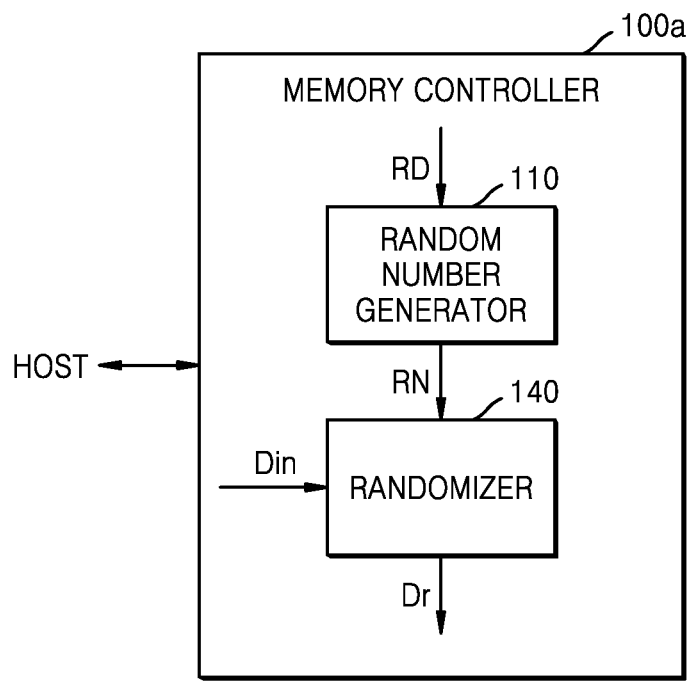
FIG. 22 is a block diagram of a memory controller according to an embodiment of the inventive concept.

FIG. 22 is a block diagram of a memory controller 100a according to an embodiment of the inventive concept.

Referring to FIG. 22, the memory controller 100a may include the random number generator 110 and a randomizer 140. The memory controller 100a according to the present embodiment may correspond to a modified embodiment of the memory controller 100 of FIG. 1, and the description made above with reference to FIGS. 1, 2, 3A, 3B, 4 to 6, 7A, 7B, 8, 9A, 9B, 10 to 14, 15A, 15B, 16, 17A, 17B, and 18 to 21 may also be applied to the present embodiment.

The random number generator 110 may generate the random number RN based on the read data RD received from the memory device (for example, 200 of FIG. 1). According to an embodiment, the random number generator 110 may be a TRNG. The randomizer 140 may randomize input data Din received from a host to random data Dr by using the random number RN. According to an embodiment, the randomizer 140 may generate the random data Dr from the input data Din by using the random number RN as at least a portion of a seed. The randomizer 140 may be named "data randomizer".

Figure 23:
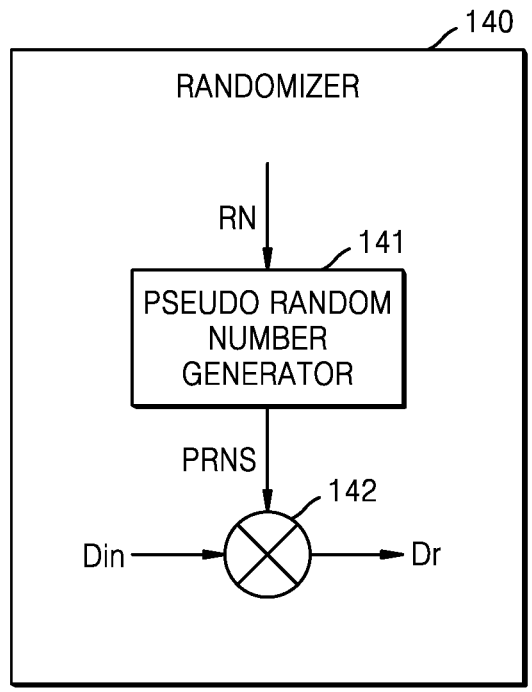
FIG. 23 is a block diagram of a randomizer according to an embodiment of the inventive concept.

In detail, FIG. 23 is a block diagram of the randomizer 140 according to an embodiment of the inventive concept.

Referring to FIG. 23, the randomizer 140 may include a pseudo random number generator 141 and a calculator 142. The pseudo random number generator 141 may generate a pseudo random number sequence PRNS from the random number RN by using the random number RN as at least a portion of a seed. For example, the pseudo random number generator 141 may include a linear feedback shift register (LFSR). The LFSR may change the pseudo random number sequence PRNS by changing an initial value named a seed or changing feedback taps.

According to an embodiment, the pseudo random number generator 141 may generate the pseudo random number sequence PRNS by using the random number RN as a seed. For example, the random number RN may have N bits, and the pseudo random number sequence PRNS may also have N bits. According to an embodiment, the pseudo random number generator 141 may generate the pseudo random number sequence PRNS by using, as a seed, the random number RN and at least one of a bit line address (i.e., column address) and a word line address (i.e., row address). For example, the random number RN may have N bits, and the pseudo random number sequence PRNS may have M bits, where M is greater than N. According to an embodiment, the pseudo random number generator 141 may generate the pseudo random number sequence PRNS by using, as a seed, the random number RN and information needed for an access operation to a memory device, such as a block address, a word line address, a bit line address, a chip identification (ID), or a number of programming times.

The calculator 142 may translate the input data Din into the random data Dr by performing a calculation on the input data Din and the pseudo random number sequence PRNS. For example, the calculator 142 may translate the input data Din into the random data Dr by performing an XOR operation on the input data Din and the pseudo random number sequence PRNS.

Figure 24:
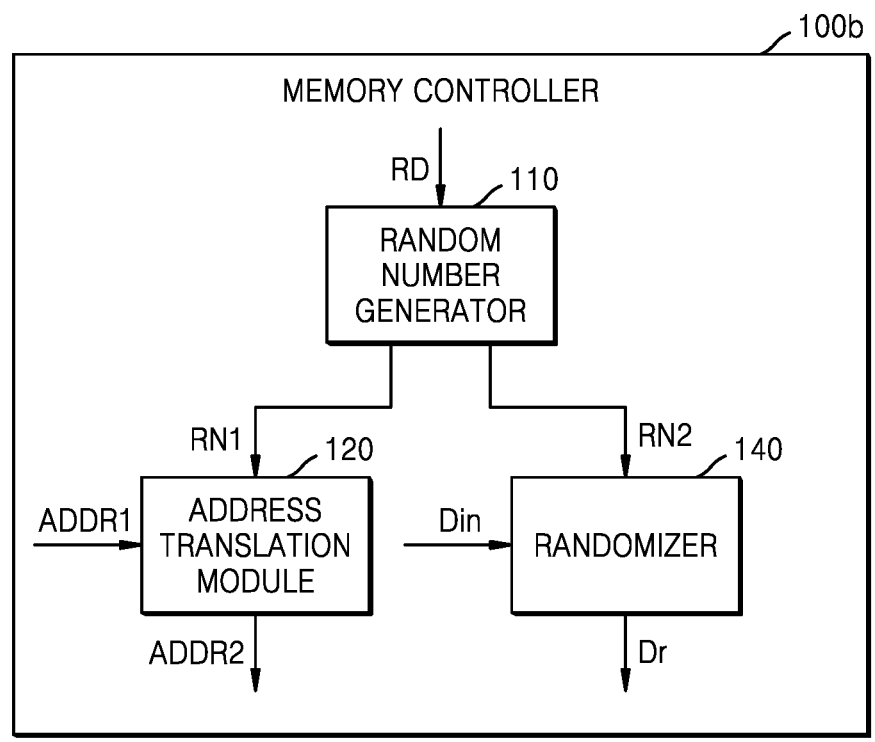
FIG. 24 is a block diagram of a memory controller according to an embodiment of the inventive concept.

FIG. 24 is a block diagram of a memory controller 100b according to an embodiment of the inventive concept.

Referring to FIG. 24, the memory controller 100b may include the random number generator 110, the address translation module 120, and the randomizer 140. The memory controller 100b may be a modified embodiment of the memory controller 100 of FIG. 1 or the memory controller 100a of FIG. 22, and the description made above with reference to FIGS. 1 to 23 may also be applied to the present embodiment.

The random number generator 110 may generate a first random number RN1 and a second random number RN2 based on the read data RD received from a memory device. According to an embodiment, the random number generator 110 may sequentially generate the first random number RN1 and the second random number RN2. However, the inventive concept is not limited thereto, and according to some embodiments, the random number generator 110 may generate the first random number RN1 and the second random number RN2 substantially at the same time. The address translation module 120 may translate the first address ADDR1 into the second address ADDR2 by using the first random number RN1. The randomizer 140 may translate the input data Din into the random data Dr by using the second random number RN2.

Figure 25:
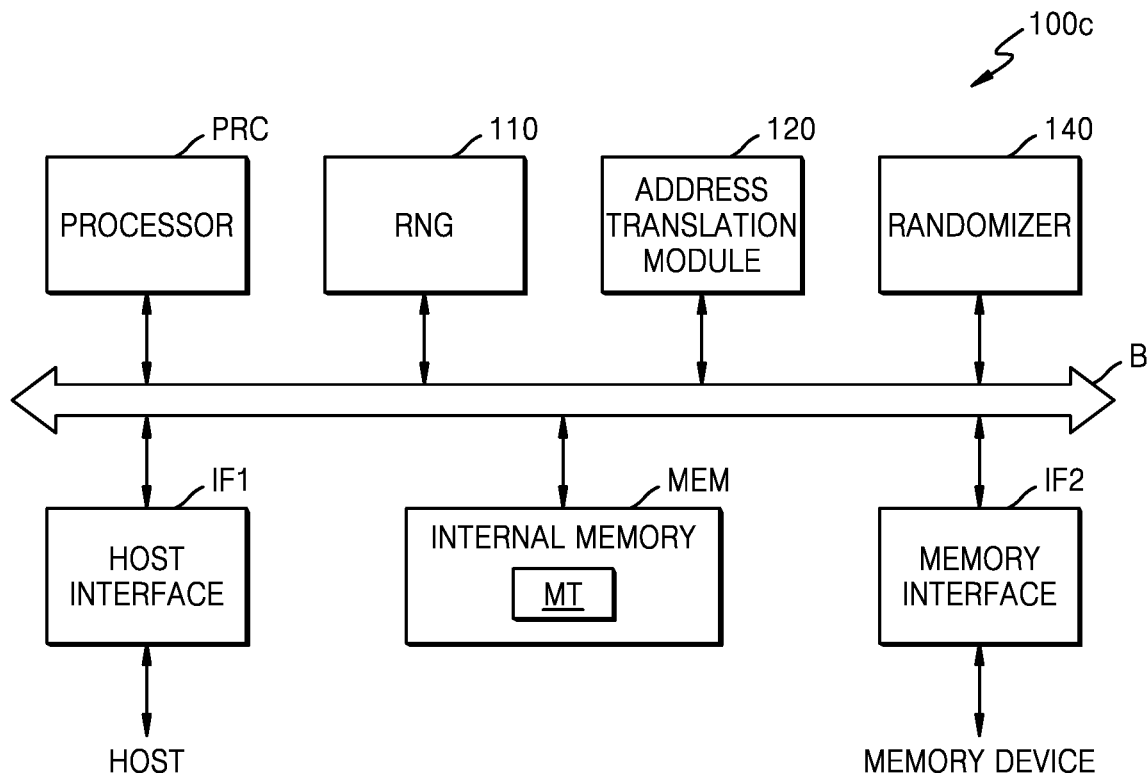
FIG. 25 is a block diagram of a memory controller according to an embodiment of the inventive concept.

FIG. 25 is a block diagram of a memory controller 100c according to an embodiment of the inventive concept.

Referring to FIG. 25, the memory controller 100c may include a processor PRC, the random number generator (RNG) 110, the address translation module 120, the randomizer 140, an internal memory MEM, a host interface IF1, and a memory interface IF2, and these components may communicate with each other via a bus B. The processor PRC may include a central processing unit (CPU), a microprocessor, or the like and control a general operation of the memory controller 100c. According to an embodiment, the processor PRC may be implemented by a multi-core processor, for example, implemented by a dual-core processor or a quad-core processor.

According to an embodiment, each of the RNG 110, the address translation module 120, and the randomizer 140 may be implemented by hardware. However, the inventive concept is not limited thereto, and at least one the RNG 110, the address translation module 120, or the randomizer 140 may be implemented by firmware or software and loaded in the internal memory MEM. The internal memory MEM operates under control of the processor PRC and may be used as an operating memory, a buffer memory, a cache memory, or the like. For example, the internal memory MEM may be implemented by a volatile memory such as DRAM or static RAM (SRAM) or a nonvolatile memory such as PRAM or a flash memory.

A mapping table (MT) may be loaded in the internal memory MEM. According to an embodiment, the MT may store mapping information between a logical address received from a host and a physical address of a memory device. According to an embodiment, the MT may store mapping information between an original physical address and a new physical address of the memory device. According to an embodiment, the MT may store write counts respectively corresponding to pages, blocks, or chips of the memory device. According to an embodiment, the MT may store a key value to be used for address translation. According to an embodiment, the MT may store key values respectively corresponding to pages, blocks, or chips of the memory device.

The host interface IF1 may provide an interface between the host and the memory controller 100c and provide an interface according to, for example, universal serial bus (USB), multimedia card (MMC), peripheral component interconnect express (PCI-E), advanced technology attachment (ATA), serial ATA (SATA), parallel ATA (PATA), small computer system interface (SCSI), serial attached SCSI (SAS), enhanced small disk interface (ESDI), integrated drive electronics (IDE), or the like.

The memory interface IF2 may provide an interface between the memory controller 100c and the memory device (for example, 200 of FIG. 1). For example, write data and read data may be transmitted and received between the memory controller 100c and the memory device 200 via the memory interface IF2. According to an embodiment, a number of memory interfaces IF2 may correspond to a number of memory chips included in a memory system or a number of channels between the memory controller 100c and the memory device 200.

Figure 26:
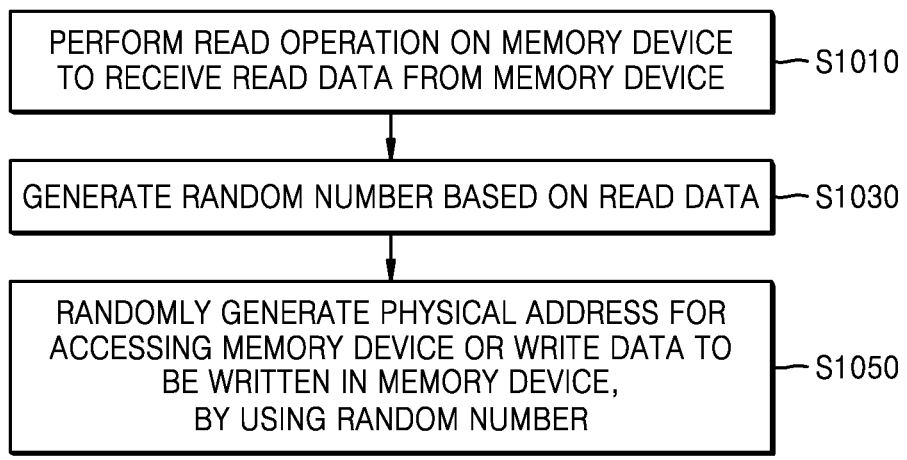
FIG. 26 is a flowchart of an operating method of a memory controller, according to an embodiment of the inventive concept.

FIG. 26 is a flowchart of an operating method of a memory controller, according to an embodiment of the inventive concept.

Referring to FIG. 26, in operation S1010, the memory controller performs a read operation on a memory device to receive read data from the memory device. In operation S1030, the memory controller generates a random number based on the read data. In operation S1050, the memory controller randomly generates a physical address for accessing the memory device or write data to be written in the memory device, by using the random number.

Figure 27:
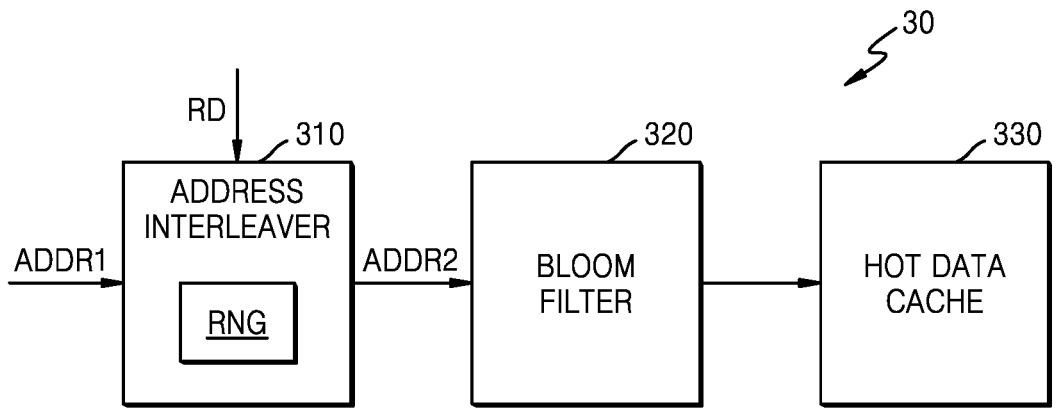
FIG. 27 is a block diagram of a memory controller according to an embodiment of the inventive concept.

FIG. 27 is a block diagram of a memory controller 30 according to an embodiment of the inventive concept.

Referring to FIG. 27, the memory controller 30 may include an address interleaver 310, a bloom filter 320, and a hot data cache 330. The address interleaver 310 may include an RNG and generate a random number based on the read data RD received from a memory device. In addition, the address interleaver 310 may translate the first address ADDR1 into the second address ADDR2 by using the random number, thereby preventing the occurrence of local wear-out in the memory device. For example, the address interleaver 310 may include the random number generator 110 and the address translation module 120 of FIG. 1.

The bloom filter 320 is a data storage and determination device using a data structure to determine whether a particular element is in a certain set. According to an embodiment, the bloom filter 320 may receive the second address ADDR2 from the address interleaver 310 and apply a hash function to the second address ADDR2 to determine whether data written in the second address ADDR2 is loaded in the hot data cache 330. When the data written in the second address ADDR2 is loaded in the hot data cache 330 as a result of the determination, the data may be read from the hot data cache 330. Otherwise, when the data written in the second address ADDR2 is not loaded in the hot data cache 330 as the result of the determination, the memory controller 30 may access the memory device and read the data from the memory device.

Figure 28:
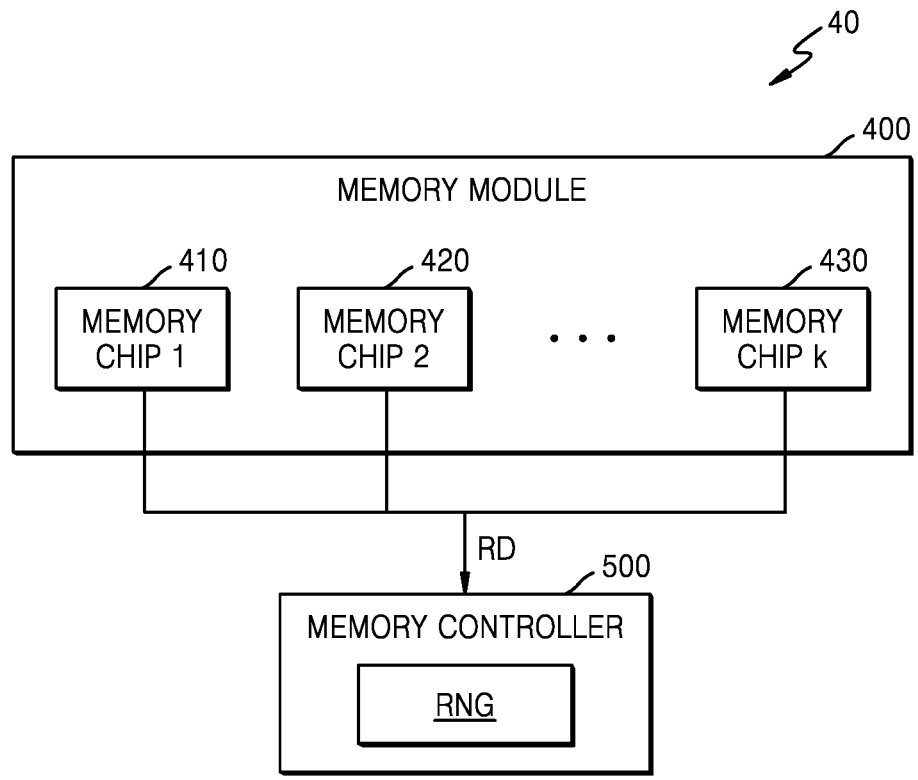
FIG. 28 is a block diagram of a memory system according to an embodiment of the inventive concept.

FIG. 28 is a block diagram of a memory system 40 according to an embodiment of the inventive concept.

Referring to FIG. 28, the memory system 40 may include a memory module 400 and a memory controller 500, and the memory module 400 may include a plurality of memory chips 410, 420, 430 mounted on a module board. The memory module 400 may be implemented in the form of a single inline memory module (SIMM) or a dual inline memory module (DIMM). Alternatively, the memory module 400 may correspond to various types of DIMMs. For example, various types of DIMMs such as a fully buffered DIMM (FB-DIMM) and a load reduced DIMM (LR-DIMM) may be applied to the memory module 400. Alternatively, the memory module 400 may correspond to a nonvolatile DIMM (NVDIMM) equipped with a nonvolatile memory (e.g., a flash memory) to supplement a problem of a volatile memory from which data is lost when power is off.

In addition, as various types of modules, FIG. 28 shows an example in which the memory module 400 includes a PRAM as a resistive memory and thus corresponds to a phase change DIMM (P-DIMM). The embodiments of the inventive concept are applicable to additional various types of modules, and for example, the memory module 400 includes 2D- or 3D-type cross point memory chips having resistive memory cells and thus may be named an) (Point DIMM (or a 3D XPoint DIMM).

The memory controller 500 may include an RNG, and the RNG may generate a random number based on the read data RD received from the memory module 400, according to the embodiments described above. The memory controller 500 may randomly generate a physical address for accessing the memory device or write data to be written in the memory module 400, by using the random number.

According to the inventive concept, a memory controller may generate a random number based on read data received from a memory device and randomly generate a physical address for accessing the memory device or write data to be written in the memory device, by using the random number, thereby reducing the occurrence of local wear-out in the memory device and performing wear-leveling. Accordingly, the endurance of a memory system including the memory device may be improved.

In addition, according to the inventive concept, the memory controller may generate a random number based on read data received from the memory device and translate a first address into a second address by using the random number, thereby not easily exposing mapping information. Accordingly, the occurrence of an endurance failure in the memory system may be prevented.

As described above, example embodiments are disclosed with reference to the drawings and the description. Although particular terms are used to describe the embodiments in the specification, these terms are used to describe the technical idea of the inventive concept but are not used to limit the meaning or limit the scope of the inventive concept in the claims. While the inventive concept has been particularly shown and described with reference to embodiments thereof, it will be understood that various changes in form and details may be made therein without departing from the spirit and scope of the following claims.

What is claimed is:
1. A memory system comprising:
 a memory device including a memory cell array having a plurality of first memory cells; and
 a memory controller configured to control the memory device, wherein the memory controller comprises:
a random number generator configured to generate a random number based on read data from the memory device; and
an address translation module configured to generate a key based on the random number and to translate a first address into a second address by performing a calculation on the first address and the key,
wherein the first address corresponds to a first physical address of the memory device,
wherein the second address corresponds to a second physical address of the memory device, and
wherein the address translation module is further configured to translate the first physical address in the second physical address when a write count for the memory device exceeds a threshold value.

2. The memory system of claim 1, wherein the address translation module is further configured to translate a logical address received from a host to a physical address of the memory device.

3. The memory system of claim 1, wherein the
write count for the memory device includes a write count for one of each block and each page of the memory cell array.

4. The memory system of claim 1, wherein the memory controller further comprises a randomizer configured to:
generate a pseudo random number sequence by using the random number as a seed, and
translate input data received from a host into random data by performing a calculation on the input data and the pseudo random number sequence.

5. The memory system of claim 1, wherein the memory controller further comprises a read/write control module configured to determine a read voltage for the plurality of first memory cells as a first voltage level and to perform a read operation on the plurality of first memory cells by using the first voltage level, and
wherein the random number generator is configured to generate the random number based on the read data from the plurality of first memory cells by using the first voltage level.

6. The memory system of claim 1, wherein the memory controller further comprises a read/write control module configured to control a first read operation on the memory device to receive first read data from the memory device, and to control a second read operation on the memory device to receive second read data from the memory device, and
wherein the random number generator is further configured to compare the first read data with the second read data to determine whether a flip bit occurs or a number of flip bits, and to generate the random number based on whether the flip bit has occurred or the number of flip bits.

7. The memory system of claim 1, wherein the memory controller further comprises a read/write control module configured to control a write operation on the plurality of first memory cells or a plurality of second memory cells arranged around the plurality of first memory cells such that threshold voltages of the plurality of first memory cells are changed, and to perform a read operation on the plurality of first memory cells after the write operation on the plurality of second memory cells is finished.

8. The memory system of claim 1, wherein the memory device comprises phase change random access memory (PRAM).

9. An operating method of a memory controller including a random number generator, the operating method comprising:
performing a read operation on a memory device to receive read data from the memory device;
generating, by the random number generator, a random number based on the read data; and
randomly generating, by using the random number, a first physical address for accessing the memory device or writing data to be written in the memory device,
wherein the performing of the read operation comprises:
performing a first read operation on a plurality of first memory ails included in memory device to receive first read data from the plurality of first memory cells; and
performing a second read operation on a plurality of second memory cells included in the memory device to receive second read data from the plurality of second memory cells, and
wherein the generating of the random number comprises:
comparing the first read data with the second read data;
determining whether a flip bit occurs or a number of flip bits based on a result of the comparison; and
generating the random number based on whether the flip bit has occurred or the number of flip bits.

10. The operating method of claim 9, further comprising, before the performing of the read operation:
determining a read voltage for a plurality of memory cells included in the memory device as a first voltage level,
wherein the generating of the random number comprises generating, by using the first voltage level, the random number based on the read data from the plurality of memory cells.

11. The operating method of claim 9, wherein the plurality of first memory cells are same as the plurality of second memory cells.

12. The operating method of claim 9, further comprising, before the performing of the read operation:
performing a write operation on a plurality of memory cells included in the memory device,
wherein the performing of the read operation comprises performing the read operation on the plurality of memory cells when a first time elapses from a time point at which the performing of the write operation has been finished.

13. The operating method of claim 9, further comprising, before the performing of the read operation:
controlling a write parameter for memory cells included in the memory device; and
performing a write operation on the memory cells by using the write parameter,
wherein the performing of the read operation comprises performing the read operation on the memory cells after the performing of the write operation on the memory cells is finished.

14. The operating method of claim 13, wherein the write parameter includes at least one of a reset voltage and a set current.

15. The operating method of claim 9, further comprising, before the performing of the read operation:
performing a first write operation on a plurality of first memory cells included in the memory device; and
performing a second write operation on a plurality of second memory cells included in the memory device and arranged around the first memory cells after the performing of the first write operation on the plurality of first memory cells is finished, wherein the performing of the read operation comprises performing the read operation on the plurality of first memory cells after the performing of the second write operation on the plurality of second memory cells is finished.

16. The operating method of claim 9, wherein the randomly generating of the first physical address comprises at least one of:

translating, by using the random number, a logical address received from a host into the first physical address of the memory device;

translating the first physical address into a second physical address by using the random number; and translating input data received from the host into random data by using the random number as a seed.

17. A memory controller comprising:

a random number generator configured to generate a random number based on read data from a memory device;

an address translation module configured to translate, by using the random number, a logical address received from a host into a first physical address of the memory device and to translate the first physical address into a second physical address of the memory device; and a randomizer configured to translate input data received from the host into random data by using the random number, wherein the address translation module comprises:

a key generator configured to generate a key from the random number; and a translator configured to generate the first physical address by performing a calculation on the logical address and the key and to generate the second physical address by performing a calculation on the first physical address and the key, and wherein the randomizer comprises:

a pseudo random number generator configured to generate a pseudo random number sequence from the random number; and a calculator configured to generate the random data by performing a calculation on the input data and the pseudo random number sequence.

18. The memory controller of claim 17, wherein the address translation module is further configured to translate the first physical address into the second physical address when a write count for the memory device exceeds a threshold value, and wherein the write count for the memory device includes a write count for one of each block and each page of the memory device.

19. The memory controller of claim 17, further comprising:

a read/write control module configured to control a first read operation on the memory device to receive first read data from the memory device, and to control a second read operation on the memory device to receive second read data from the memory device, wherein the random number generator is further configured to compare the first read data with the second read data to determine whether a flip bit occurs or a number of flip bits, and to generate the random number based on whether the flip bit has occurred or the number of flip bits.

* * * * *